US009767823B2

(12) United States Patent
Villette et al.

(10) Patent No.: US 9,767,823 B2
(45) Date of Patent: Sep. 19, 2017

(54) DEVICES FOR ENCODING AND DETECTING A WATERMARKED SIGNAL

(75) Inventors: Stephane Pierre Villette, San Diego, CA (US); Daniel J. Sinder, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 998 days.

(21) Appl. No.: 13/276,115

(22) Filed: Oct. 18, 2011

(65) Prior Publication Data

US 2012/0203556 A1 Aug. 9, 2012

Related U.S. Application Data

(60) Provisional application No. 61/440,332, filed on Feb. 7, 2011.

(51) Int. Cl.

*G10L 21/00* (2013.01)
*G10L 21/038* (2013.01)
*G10L 19/018* (2013.01)
*G10L 19/00* (2013.01)
*H03M 13/00* (2006.01)
(Continued)

(52) U.S. Cl.

CPC .......... *G10L 21/038* (2013.01); *G10L 19/018* (2013.01); *G10L 19/005* (2013.01)

(58) Field of Classification Search

USPC ............... 704/270, 219, 500, 201, 282, 211; 713/176, 400; 235/382; 382/100; 283/113; 726/33; 714/6.32, 752, 798, 714/755; 380/205, 54; 700/94; 370/333, 370/342; 701/1

See application file for complete search history.

(56) References Cited

U.S. PATENT DOCUMENTS 6,061,793 A 5/2000 Tewfik et al.
6,208,735 B1 * 3/2001 Cox ...................... G06T 1/0028 283/113

(Continued)

FOREIGN PATENT DOCUMENTS

CN 1437169 A 8/2003
CN 1575492 A 2/2005

(Continued)

OTHER PUBLICATIONS

Ding, H.,"Wideband Audio Over Narrowband Low-Resolution Media," IEEE International Conference on Acoustics, Speech, and Signal Processing, 2004. (ICASSP '04). vol. 1, May 17-21, 2004, pp. I-489 to I-492.

(Continued)

*Primary Examiner* — Neeraj Sharma
(74) *Attorney, Agent, or Firm* — Austin Rapp & Hardman, P.C.

(57) ABSTRACT

A method for decoding a signal on an electronic device is described. The method includes receiving a signal. The method also includes extracting a bitstream from the signal. The method further includes performing watermark error checking on the bitstream for multiple frames. The method additionally includes determining whether watermark data is detected based on the watermark error checking. The method also includes decoding the bitstream to obtain a decoded second signal if the watermark data is not detected.

30 Claims, 10 Drawing Sheets

(51) Int. Cl.

| | |
|---|---|
| *G06F 11/00* | (2006.01) |
| *H04W 4/00* | (2009.01) |
| *H04B 7/216* | (2006.01) |
| *G09C 3/00* | (2006.01) |
| *H04N 7/167* | (2011.01) |
| *G06K 5/00* | (2006.01) |
| *G06K 9/00* | (2006.01) |
| *H04L 9/32* | (2006.01) |
| *G06F 1/12* | (2006.01) |
| *G06F 17/00* | (2006.01) |
| *G06F 7/04* | (2006.01) |
| *G06F 7/00* | (2006.01) |
| *B42D 15/00* | (2006.01) |
| *G10L 19/005* | (2013.01) |

(56) References Cited

U.S. PATENT DOCUMENTS

| | | | |
|---|---|---|---|
| 6,330,672 | B1 | 12/2001 | Shur |
| 6,332,030 | B1 | 12/2001 | Manjunath et al. |
| 6,359,998 | B1 * | 3/2002 | Cooklev ................ G06T 1/005 382/100 |
| 6,418,424 | B1 | 7/2002 | Hoffberg et al. |
| 6,442,285 | B2 * | 8/2002 | Rhoads et al. ................ 382/100 |
| 6,490,683 | B1 * | 12/2002 | Yamada ........... G11B 20/00086 713/176 |
| 6,493,457 | B1 | 12/2002 | Quackenbush et al. |
| 7,389,420 | B2 * | 6/2008 | Tian .............................. 713/176 |
| 7,596,492 | B2 | 9/2009 | Sung et al. |
| 7,860,992 | B2 | 12/2010 | Robinson |
| 7,974,846 | B2 | 7/2011 | Tsuchinaga et al. |
| 8,151,113 | B2 * | 4/2012 | Rhoads ......................... 713/176 |
| 2001/0049788 | A1 | 12/2001 | Shur |
| 2002/0128839 | A1 | 9/2002 | Lindgren et al. |
| 2003/0088327 | A1 | 5/2003 | Taori et al. |
| 2003/0154073 | A1 | 8/2003 | Ota et al. |
| 2003/0163305 | A1 * | 8/2003 | Cheng et al. ................ 704/219 |
| 2003/0226098 | A1 * | 12/2003 | Weng ................ G06K 9/00503 714/798 |
| 2004/0068399 | A1 | 4/2004 | Ding |
| 2004/0068404 | A1 | 4/2004 | Tanaka et al. |
| 2004/0172563 | A1 * | 9/2004 | Brondijk .............. G11B 19/122 726/33 |
| 2004/0186735 | A1 | 9/2004 | Ferris et al. |
| 2005/0002526 | A1 | 1/2005 | Choi et al. |
| 2005/0023343 | A1 * | 2/2005 | Tsuchinaga et al. ......... 235/382 |
| 2005/0094848 | A1 | 5/2005 | Carr et al. |
| 2005/0174981 | A1 * | 8/2005 | Heath ................... H04W 16/14 370/342 |
| 2006/0045309 | A1 | 3/2006 | Suthaharan |
| 2006/0047374 | A1 * | 3/2006 | Hashimoto ............... G06F 1/30 701/1 |
| 2006/0075241 | A1 | 4/2006 | Deguillaume et al. |
| 2006/0173677 | A1 | 8/2006 | Sato et al. |
| 2006/0227968 | A1 * | 10/2006 | Chen ..................... G10L 19/018 380/205 |
| 2006/0230306 | A1 * | 10/2006 | Richards ............... G06F 11/076 714/6.32 |
| 2006/0239502 | A1 | 10/2006 | Petrovic et al. |
| 2006/0268962 | A1 * | 11/2006 | Cairns .................... H04B 1/712 375/148 |
| 2006/0271355 | A1 | 11/2006 | Wang et al. |
| 2006/0282263 | A1 | 12/2006 | Vos et al. |
| 2007/0094009 | A1 | 4/2007 | Ryu et al. |
| 2007/0217626 | A1 | 9/2007 | Sharma et al. |
| 2008/0027711 | A1 | 1/2008 | Rajendran et al. |
| 2008/0080431 | A1 * | 4/2008 | Zeira .................... H04B 7/0634 370/333 |
| 2008/0115031 | A1 * | 5/2008 | Shen ................. H03M 13/2975 714/755 |
| 2008/0226121 | A1 * | 9/2008 | Tewfik .................. G06T 1/0071 382/100 |
| 2008/0250091 | A1 | 10/2008 | Lacy et al. |
| 2008/0263359 | A1 | 10/2008 | Radzishevsky |
| 2008/0288263 | A1 * | 11/2008 | Jung et al. .................... 704/500 |
| 2009/0094264 | A1 | 4/2009 | Nurminen et al. |
| 2009/0157204 | A1 * | 6/2009 | Smith .................. G10L 19/018 700/94 |
| 2009/0326961 | A1 | 12/2009 | Petrovic et al. |
| 2010/0106269 | A1 | 4/2010 | Garudadri et al. |
| 2010/0228541 | A1 | 9/2010 | Oshikiri |
| 2010/0332939 | A1 * | 12/2010 | Shimanuki ............ H04L 1/0066 714/752 |
| 2011/0033081 | A1 * | 2/2011 | Davidson et al. ............ 382/100 |
| 2011/0131047 | A1 | 6/2011 | Geiser et al. |
| 2011/0208514 | A1 | 8/2011 | Tsuchinaga et al. |
| 2012/0022879 | A1 | 1/2012 | Srinivasan |
| 2012/0185721 | A1 * | 7/2012 | Burgt ........................ G06F 1/12 713/400 |
| 2012/0203555 | A1 | 8/2012 | Villette et al. |
| 2012/0203561 | A1 | 8/2012 | Villette et al. |
| 2012/0221342 | A1 | 8/2012 | Oshikiri |

FOREIGN PATENT DOCUMENTS

| | | | |
|---|---|---|---|
| CN | 101262418 | A | 9/2008 |
| CN | 101271690 | A | 9/2008 |
| CN | 101345054 | A | 1/2009 |
| CN | 101577605 | A | 11/2009 |
| EP | 1503369 | A2 | 2/2005 |
| EP | 1959432 | A1 | 8/2008 |
| JP | H10513571 | A | 12/1998 |
| JP | 2003295879 | A | 10/2003 |
| JP | 2004069963 | A | 3/2004 |
| JP | 2004158913 | A | 6/2004 |
| JP | 2004310117 | A | 11/2004 |
| JP | 2004348120 | A | 12/2004 |
| JP | 2005049794 | A | 2/2005 |
| JP | 2005506584 | A | 3/2005 |
| JP | 2005513543 | A | 5/2005 |
| JP | 2006524358 | A | 10/2006 |
| JP | 2007048340 | A | 2/2007 |
| JP | 2008539671 | A | 11/2008 |
| JP | 2010020333 | A | 1/2010 |
| TW | 200943899 | A | 10/2009 |
| WO | WO-9624925 | A1 | 8/1996 |
| WO | WO-0062501 | A2 | 10/2000 |
| WO | WO03036624 | A1 | 5/2003 |
| WO | WO03047138 | A1 | 6/2003 |
| WO | WO-03053064 | A1 | 6/2003 |
| WO | WO-2004090886 | A1 | 10/2004 |
| WO | WO-2006116394 | A2 | 11/2006 |
| WO | WO2007043811 | A1 | 4/2007 |
| WO | 2007051124 | | 5/2007 |
| WO | WO-2007063913 | A1 | 6/2007 |
| WO | WO2008016947 | | 2/2008 |
| WO | WO-2010059342 | A1 | 5/2010 |

OTHER PUBLICATIONS

Geiser, B., et al., "Artificial Bandwidth Extension of Speech Supported by Watermark-Transmitted Side Information", Inter Speech, Institute of Communication Systems and Data Processing, Sep. 4-8, 2005, pp. 1497-1500.

Geiser, B., et al., "Backwards Compatible wideband Telephony in Mobile Networks: CELP Watermarking and Bandwidth Extension", IEEE, Institute of Communication Systems and Data Processing, 2007, pp. IV 533-536.

Geiser, B., et al., "Robust Wideband Enhancement of Speech by Combined Coding and Artificial Bandwidth Extension", Institute of Communication Systems and Data Processing, Jan. 2005, pp. 21-24.

Loo, P., et al., "Watermark Detection Based on the Properties of Error Control Codes" IEE Proc.-Vis. Image Signal Process., vol. 150, No. 2, Apr. 2003, pp. 115-121.

Luo, Z. et al., "Wideband Audio Over Narrow Band Based on Digital Watermarking", IEEE, School of Information Technology and Engineering, Jun. 2010, pp. 697-701.

Nishimura, A. et al., "Data Hiding in Pitch Delay Data of the Adaptive Multi-Rate Narrow-band Speech Codec", IEEE, Fifth

(56) References Cited

OTHER PUBLICATIONS

International Conference on Intelligent Information Hiding and Multimedia Signal Processing, 2009, pp. 483-486.
Vary, P. et al., "Steganographic Wideband Telephony Using Narrowband Speech Codecs", Conference Record of the Forty-First Asilomar Conference on Signals, Systems and Computers, 2007, pp. 1475-1479, Nov. 4-7, 2007. doi: 10.1109/ACSSC.2007.4487475.
Bernd Geiser., et al., "High rate data hiding in ACELP speech codecs", Acoustics, Speech and Signal Processing, 2008, ICASSP 2008, IEEE International Conference On, IEEE, Piscataway, NJ, USA, Mar. 31, 2008 (Mar. 31, 2008), pp. 4005-4008, XP031251474, ISBN : 978-1-4244-1483-3 paragraph [03.2] ; table 2.
International Search Report and Written Opinion—PCT/US2012/020768—ISA/EPO—Apr. 23, 2012.
Taiwan Search Report—TW101100831—TIPO—Aug. 1, 2014.
Global System for Mobile Communications: "Digital Cellular Telecommunications System; Enhanced Full Rate (EFR) Speech Transcoding", France, European Telecommunication Standard Institute, Mar. 1996, pp. 14, 15.

* cited by examiner

DEVICES FOR ENCODING AND DETECTING A WATERMARKED SIGNAL

RELATED APPLICATIONS

This application is related to and claims priority from U.S. Provisional Patent Application Ser. No. 61/440,332 filed Feb. 7, 2011, for "ERROR DETECTION FOR WATERMARKING CODECS."

TECHNICAL FIELD

The present disclosure relates generally to electronic devices. More specifically, the present disclosure relates to devices for encoding and detecting a watermarked signal.

BACKGROUND

In the last several decades, the use of electronic devices has become common. In particular, advances in electronic technology have reduced the cost of increasingly complex and useful electronic devices. Cost reduction and consumer demand have proliferated the use of electronic devices such that they are practically ubiquitous in modern society. As the use of electronic devices has expanded, so has the demand for new and improved features of electronic devices. More specifically, electronic devices that perform functions faster, more efficiently or with higher quality are often sought after.

Some electronic devices (e.g., cellular phones, smart phones, computers, etc.) use audio or speech signals. These electronic devices may encode speech signals for storage or transmission. For example, a cellular phone captures a user's voice or speech using a microphone. For instance, the cellular phone converts an acoustic signal into an electronic signal using the microphone. This electronic signal may then be formatted for transmission to another device (e.g., cellular phone, smart phone, computer, etc.) or for storage.

Improved quality or additional capacity in a communicated signal is often sought for. For example, cellular phone users may desire greater quality in a communicated speech signal. However, improved quality or additional capacity may often require greater bandwidth resources and/or new network infrastructure. As can be observed from this discussion, systems and methods that allow improved signal communication may be beneficial.

SUMMARY

A method for decoding a signal on an electronic device is disclosed. The method includes receiving a signal. The method also includes extracting a bitstream from the signal. The method further includes performing watermark error checking on the bitstream for multiple frames. The method additionally includes determining whether watermark data is detected based on the watermark error checking. The method also includes decoding the bitstream to obtain a decoded second signal if the watermark data is not detected. The watermark error checking may be based on a cyclic redundancy check.

If the watermark data is detected, the method may further include modeling the watermark data to obtain a decoded first signal and decoding the bitstream to obtain a decoded second signal. If the watermark data is detected, the method may additionally include determining whether an error is detected based on the watermark error checking and combining the decoded first signal and the decoded second signal if no error is detected. Determining whether an error is detected may be further based on performing error checking on the bitstream that is not specific to the watermark data. If an error is detected, the method may also include concealing the decoded first signal to obtain an error concealment output and combining the error concealment output and the decoded second signal.

Determining whether the watermark data is detected may include determining whether more than a number M of error check codes indicate correct data reception within a number N of the multiple frames. The multiple frames may be consecutive frames. Determining whether the watermark data is detected may be based on combining error check decisions from temporally distinct frames. Determining whether the watermark data is detected may be performed in real time.

A method for encoding a watermarked signal on an electronic device is also disclosed. The method includes obtaining a first signal and a second signal. The method also includes modeling the first signal to obtain watermark data. The method further includes adding an error check code to multiple frames of the watermark data. The method additionally includes encoding the second signal. Furthermore, the method includes embedding the watermark data into the second signal to obtain a watermarked second signal. The method also includes sending the watermarked second signal.

The error check code may be based on a cyclic redundancy check code. Adding the error check code to the watermark data may include adding an amount of error check code to the multiple frames that is smaller than is needed for reliable error checking on individual frames. A proportion equal to or smaller than four error check bits per twenty information bits may be the amount of error check code added to each frame.

An electronic device configured for decoding a signal is also disclosed. The electronic device includes watermark detection circuitry that performs watermark error checking on a bitstream for multiple frames and determines whether watermark data is detected based on the watermark error checking. The electronic device also includes decoder circuitry coupled to the watermark detection circuitry. The decoder circuitry decodes the bitstream to obtain a decoded second signal if the watermark data is not detected.

An electronic device for encoding a watermarked signal is also disclosed. The electronic device includes modeler circuitry that models a first signal to obtain watermark data. The electronic device also includes watermark error check coding circuitry coupled to the modeler circuitry. The watermark error check coding circuitry adds an error check code to multiple frames of the watermark data. The electronic device further includes coder circuitry coupled to the watermark error check coding circuitry. The coder circuitry encodes a second signal and embeds the watermark data into the second signal to obtain a watermarked second signal.

A computer-program product for decoding a signal is also disclosed. The computer-program product includes a non-transitory tangible computer-readable medium with instructions. The instructions include code for causing an electronic device to receive a signal. The instructions also include code for causing the electronic device to extract a bitstream from the signal. The instructions further include code for causing the electronic device to perform watermark error checking on the bitstream for multiple frames. The instructions additionally include code for causing the electronic device to determine whether watermark data is detected based on the watermark error checking. The instructions also include code for causing the electronic device to decode the bitstream to obtain a decoded second signal if the watermark data is not detected.

A computer-program product for encoding a watermarked signal is also disclosed. The computer-program product includes a non-transitory tangible computer-readable medium with instructions. The instructions include code for causing an electronic device to obtain a first signal and a second signal. The instructions also include code for causing the electronic device to model the first signal to obtain watermark data. The instructions further include code for causing the electronic device to add an error check code to multiple frames of the watermark data. The instructions additionally include code for causing the electronic device to encode the second signal. The instructions also include code for causing the electronic device to embed the watermark data into the second signal to obtain a watermarked second signal. The instructions further include code for causing the electronic device to send the watermarked second signal.

An apparatus for decoding a signal is also disclosed. The apparatus includes means for receiving a signal. The apparatus also includes means for extracting a bitstream from the signal. The apparatus further includes means for performing watermark error checking on the bitstream for multiple frames. The apparatus additionally includes means for determining whether watermark data is detected based on the watermark error checking. The apparatus also includes means for decoding the bitstream to obtain a decoded second signal if the watermark data is not detected.

An apparatus for encoding a watermarked signal is also disclosed. The apparatus includes means for obtaining a first signal and a second signal. The apparatus also includes means for modeling the first signal to obtain watermark data. The apparatus further includes means for adding an error check code to multiple frames of the watermark data. The apparatus additionally includes means for encoding the second signal. The apparatus also includes means for embedding the watermark data into the second signal to obtain a watermarked second signal. The apparatus also includes means for sending the watermarked second signal.

DETAILED DESCRIPTION

Figure 1:
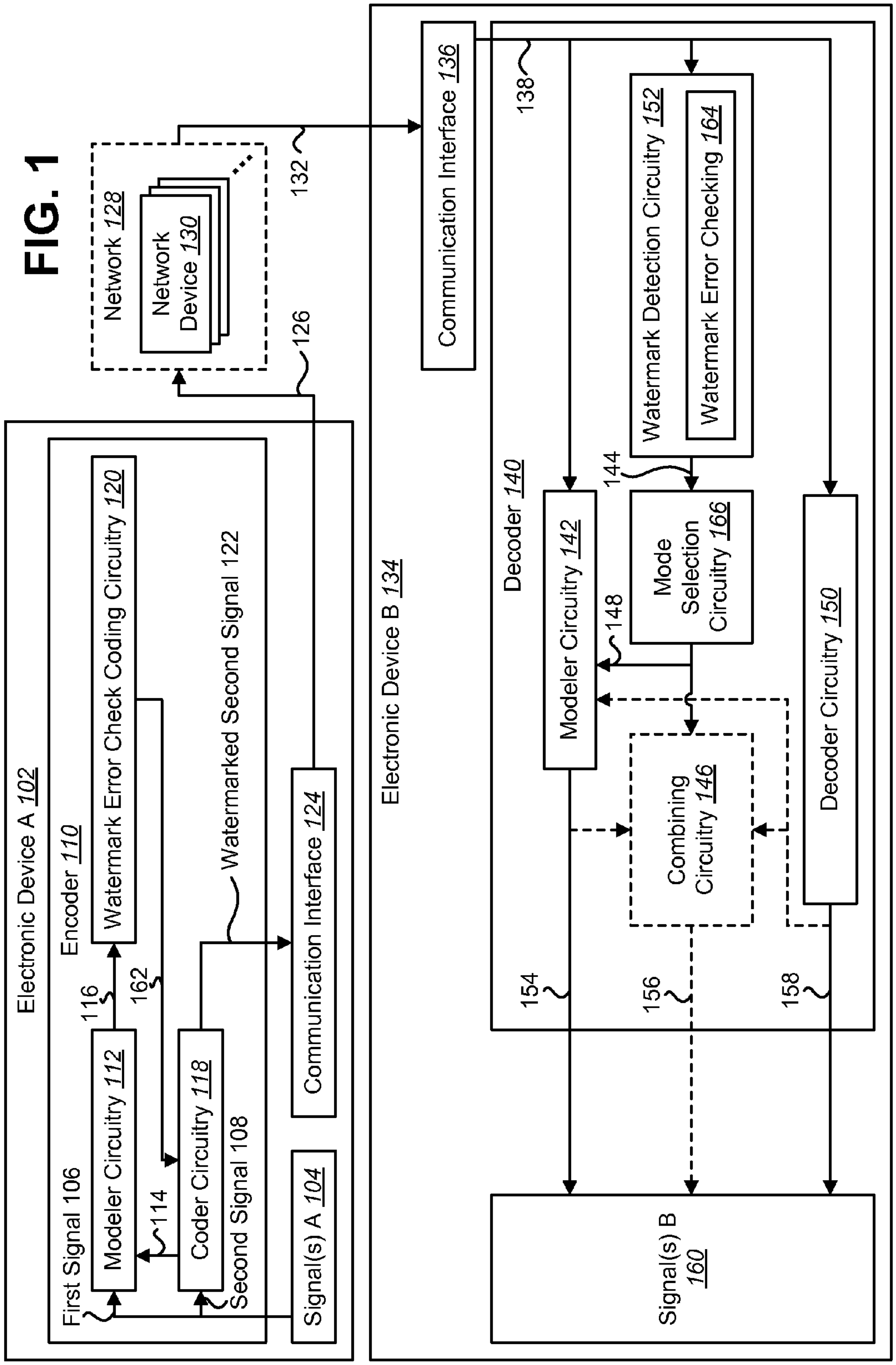
FIG. 1 is a block diagram illustrating one configuration of electronic devices in which systems and methods for encoding and detecting a watermarked signal may be implemented.

The systems and methods disclosed herein may be applied to a variety of electronic devices. Examples of electronic devices include voice recorders, video cameras, audio players (e.g., Moving Picture Experts Group-1 (MPEG-1) or MPEG-2 Audio Layer 3 (MP3) players), video players, audio recorders, desktop computers, laptop computers, personal digital assistants (PDAs), gaming systems, etc. One kind of electronic device is a communication device, which may communicate with another device. Examples of communication devices include telephones, laptop computers, desktop computers, cellular phones, smartphones, wireless or wired modems, e-readers, tablet devices, gaming systems, cellular telephone base stations or nodes, access points, wireless gateways and wireless routers.

An electronic device or communication device may operate in accordance with certain industry standards, such as International Telecommunication Union (ITU) standards and/or Institute of Electrical and Electronics Engineers (IEEE) standards (e.g., Wireless Fidelity or "Wi-Fi" standards such as 802.11a, 802.11b, 802.11g, 802.11n and/or 802.11ac). Other examples of standards that a communication device may comply with include IEEE 802.16 (e.g., Worldwide Interoperability for Microwave Access or "WiMAX"), Third Generation Partnership Project (3GPP), 3GPP Long Term Evolution (LTE), Global System for Mobile Telecommunications (GSM), Universal Mobile Telecommunications System (UMTS) and others (where a communication device may be referred to as a User Equipment (UE), Node B, evolved Node B (eNB), mobile device, mobile station, subscriber station, remote station, access terminal, mobile terminal, terminal, user terminal, subscriber unit, etc., for example). While some of the systems and methods disclosed herein may be described in terms of one or more standards, this should not limit the scope of the disclosure, as the systems and methods may be applicable to many systems and/or standards.

It should be noted that some communication devices may communicate wirelessly and/or may communicate using a wired connection or link. For example, some communication devices may communicate with other devices using an Ethernet protocol. The systems and methods disclosed herein may be applied to communication devices that communicate wirelessly and/or that communicate using a wired connection or link. In one configuration, the systems and methods disclosed herein may be applied to a communication device that communicates with another device using a satellite.

As used herein, the term "couple" and variations thereof may denote a direct connection or an indirect connection. For example, if a first component is coupled to a second component, the first component may be directly connected to the second component or may be indirectly connected to the second component (through a third component, for example).

It should be noted that the term "frame" as used herein may denote a quantity of information or data. For example, a frame may be a packet of data. In some configurations, a frame may be defined in terms of time and/or a number of bits. For example, a frame may include a number of bits within a period of time. One or more of the devices described herein may communicate using frames of data. For example, digital data (e.g., bits) may be grouped into frames for encoding, transmission, reception, decoding and/or other operations.

One configuration of the systems and methods disclosed herein describes an error detection scheme for watermarking codecs (e.g., speech codecs). Data hiding or watermarking in speech codec bit streams allows the transmission of extra data in-band with no changes to network infrastructure. This can be used for a range of applications, such as authentication or data hiding, without incurring the high costs of deploying new infrastructure for a new codec. One application of watermarking is bandwidth extension, in which one codec's bitstream (e.g., a conventional and/or deployed codec bitstream) is used as a carrier for hidden bits containing information for high quality bandwidth extension. Decoding the carrier bitstream and the hidden bits may allow synthesis of a bandwidth that is greater than the bandwidth of the carrier codec. Thus, a wider bandwidth may be achieved without altering the network infrastructure.

For example, a standard narrowband codec can be used to encode a 0-4 kilohertz (kHz) low-band part of speech, while a 4-7 kHz high-band part may be modeled or encoded separately. Bits for the high band may be hidden within (e.g., watermarked into) the low-band (e.g., narrowband) speech bitstream. In this case, wideband speech may be decoded at the receiver despite using the legacy narrowband bitstream. Similarly, a standard wideband codec may be used to encode a 0-7 kHz low-band part of speech, while a 7-14 kHz high-band part may be modeled or encoded separately and hidden (e.g., watermarked) in the wideband bitstream. In this case, super-wideband may be decoded at the receiver despite using the legacy wideband bitstream.

One example of the systems and methods disclosed herein describes detection of the presence of watermark information and protection against instances (e.g., speech frames) for which error-free decoding of the watermark cannot be guaranteed. Since many watermarking codecs may operate on legacy networks, the decoder may not have a priori knowledge regarding the watermarking capability of the encoder. Also, many watermarks may be destroyed by decoding and re-encoding in the network, as is common with tandem operation and transcoding. A decoder equipped to extract and decode the watermark may need to have high confidence that the watermark is indeed present. Otherwise, the data extracted from the bitstream may be garbage. In one configuration, this could result in severely degraded output speech quality.

Given the possibility of bit and/or frame errors, and the possibility of hand-offs between tandem-free/transcoder-free operation (TFO/TrFO) networks and tendering/transcoding networks, the decoder may potentially deal with the sudden loss of the watermark (e.g., high-band) information without adverse impact to quality. In one example, the high band could fluctuate in and out without protection against these errors, which may be a very annoying artifact for the listener.

The systems and methods disclosed herein may help to solve the above problem. In one configuration, the systems and methods disclosed herein involve the combined use of an error checking mechanism together with an error averaging scheme and error concealment (for the high band, for example) to reduce the probability of false alarms and false positives while also limiting the amount of bandwidth switching.

The systems and methods disclosed herein may track the detection decision (based on a CRC error check, for example) over multiple frames, and may use a simple state machine to determine whether the decoder is in "enhanced mode" (where a high band is decoded and wideband speech is synthesized, for example) or "conventional mode" (where watermarking is ignored, for example). An averaging scheme (e.g., a simple "majority rules" scheme) may be used to control the state. For example, a 4-bit CRC result may be tracked over N frames (e.g., N=12) for a decision, and enhanced mode may be selected if more than a number of M frames (e.g., M=7 of N=12) have the correct CRC (e.g., 4-bit CRC). Such an approach may allow for a very low rate of false detection of the watermark, while keeping the overhead to a minimum.

The approach described above may allow for a very low rate of false detection of a watermark, while reducing overhead. In addition to the general status of the communication (e.g., call) as described above, channel errors may cause spurious/transient errors in the watermark. These may be detected in several ways: a cyclic redundancy check (CRC) may be decoded incorrectly and/or the carrier decoder may have detected a frame loss (e.g., bad frame indication (BFI) for an adaptive multi-rate (AMR) codec (e.g., narrowband AMR (AMR-NB))). In such cases, it may be beneficial to maintain a wideband output, for example. This may be done rather than risk fast bandwidth switching that can cause artifacts. In these instances, for example, error concealment techniques may be used on the high band to gracefully extrapolate and attenuate the high band. In this way, if the loss of the watermark is brief, a user may not even perceive the loss of the high band for this brief period of time.

It should be noted that typical CRC techniques may require more bits (than are used in accordance with the systems and methods herein) to protect against misdetection, and therefore have a larger quality impact to the carrier/legacy bitstream. Also, without the averaging scheme and error concealment (in the high band, for example), switching between bandwidths may result in substantially worse quality, which may be detected by a listener.

Due to the impact of the watermark on the carrier bitstream, it may be beneficial to reduce the bit rate of the watermark in some configurations. At odds with this, for example, is including bits for both high-band encoded parameters and error detection (e.g., CRC) such that high quality is achieved with a low probability of erroneous watermark detection. One design improvement is thus to limit the number of bits used for error detection and combine it with an averaging scheme that takes into account the typical patterns of loss seen in the target networks.

In one configuration, four bits of cyclic redundancy check (CRC) (per frame, for example) may be used to detect errors in watermark information. This error detection may have two uses. One use may be the detection of an enhanced or watermark mode versus a conventional or legacy mode. For example, CRC results may be tracked over a number of N frames (e.g., N=12) to determine or decide which mode of operation to use. For instance, an enhanced mode may be indicated if CRC results are correct for a number of M frames (e.g., if CRC results are correct for more than M=7 frames). Thus, a wideband output may be produced (in enhanced mode, for example) if greater than M of N frames includes a correct CRC code.

Another use of the error detection may be to detect errors. However, the error detection used may not be enough to reliably determine all errors. Other error detection (e.g., a bad frame indication (BFI) for the low band) may be used to catch errors in addition to or alternatively from the watermark error detection. It should be noted that some errors may remain due to discontinuous transmission (DTX) causing mismatches. For example, synthesis at an encoder may not be bit exact with DTX on. Other errors may remain, such as for class C bits. It should be noted that the concept of class C bits may be specific to AMR-NB over GSM/UMTS systems. For example, some less important bits of AMR-NB are not protected by a CRC, since errors on them would have only a small impact on speech quality, and this saves bits. This may be a limitation of the bad frame indication (BFI). However, 4-bit CRC may catch most such errors. It should be noted that a channel simulator may be used for more precise tuning. For example, the number of frames N, the number of frames M and/or the number of bits used for CRC may be tuned. The systems and methods may be used over-the-air (OTA) on commercial networks in some configurations.

Watermarking techniques may hide bits on a fixed codebook (FCB) of an algebraic code excited linear prediction (ACELP) coder (e.g., adaptive multi-rate narrowband or AMR-NB) by hiding a number of bits per FCB track. The bits are hidden by restricting the number of allowed pulse combinations. In the case of AMR-NB, where there are two pulses per track, one approach includes constraining the pulse positions so that an exclusive OR (XOR) of the two pulse positions on a given track are equal to the watermark to transmit. One or two bits per track may be transmitted this way. This and/or other watermarking approaches may be used in accordance with the systems and methods disclosed herein.

In some configurations, the systems and methods disclosed herein may be used to provide a codec that is a backward interoperable version of narrowband AMR 12.2 (where 12.2 refers to a bit rate of 12.2 kilobits per second (kbps)). For convenience, this codec may be referred to as "eAMR" herein, though the codec could be referred to using a different term. eAMR may have the ability to transport a "thin" layer of wideband information hidden within a narrowband bit stream. This may provide true wideband encoding and not blind bandwidth extension. eAMR may make use of watermarking (e.g., stenography) technology and may require no out-of-band signaling. In some configurations, an encoder may detect a legacy remote and stop adding watermark, returning to AMR 12.2 quality. It should be noted that the systems and methods disclosed herein may be applied to other rates of AMR. For example, the systems and methods disclosed herein may be implemented for all eight rates of AMR. The systems and methods may work across the rates, so that CRC averaging will take place over N frames, even if these frames are at different rates. This is made simple by the fact that a 4-bit CRC is used for all rates, for example.

A comparison between eAMR and Adaptive Multi-Rate Wideband (AMR-WB) is given hereafter. eAMR may provide true wideband quality and not blind bandwidth extension. eAMR may use a bit rate of 12.2 kilobits per second (kbps). In some configurations, eAMR may require new handsets (with wideband acoustics, for example). eAMR may be transparent to existing GSM Radio Access Network (GRAN) and/or Universal Terrestrial Radio Access Network (UTRAN) infrastructure (thus having no network cost impact, for example). eAMR may be deployed on both 2G and 3G networks without any software upgrade in the core network. eAMR may require tandem-free/transcoder-free operation (TFO/TrFO) of a network for wideband quality. eAMR may automatically adapt to changes in TFO/TrFO. It should be noted that in some cases, some TrFO networks may manipulate fixed codebook (FCB) gain bits. However, this may not affect eAMR operation.

eAMR may be compared to AMR-WB as follows. AMR-WB may offer true wideband quality. AMR-WB may use a bit rate of 12.65 kbps. AMR-WB may require new handsets (with wideband acoustics, for example) and infrastructure modifications. AMR-WB may require a new Radio Access Bearer (RAB) and associated deployment costs. Implementing AMR-WB may be a significant issue with the legacy 2G network and may require overall mobile switching center (MSC) restructuring. AMR-WB may require TFO/TrFO for wideband quality. It should be noted that changes in TFO/TrFO may be potentially problematic for AMR-WB.

More detail on one example of an AMR 12.2 ACELP fixed codebook is given hereafter. The codebook excitation is made of pulses and allows efficient computations. In Enhanced Full Rate (EFR), each 20 millisecond (ms) frame (of 160 samples, for example) is split into 4×5 ms frames of 40 samples. Each subframe of 40 samples is split into five interleaved tracks with eight positions per track. Two pulses and 1 sign bit may be used per track, where the order of pulses determines the second sign. Stacking may be allowed. (2*3+1)*5=35 bits may be used per subframe. One example of tracks, pulses, amplitudes and positions that may be used according to an ACELP fixed codebook is given in Table (1).

TABLE (1)

| Track | Pulses | Amplitudes | Positions |
|---|---|---|---|
| 1 | 0, 5 | ±1, ±1 | 0, 5, 10, 15, 20, 25, 30, 35 |
| 2 | 1, 6 | ±1, ±1 | 1, 6, 11, 16, 21, 26, 31, 36 |
| 3 | 2, 7 | ±1, ±1 | 2, 7, 12, 17, 22, 27, 32, 37 |
| 4 | 3, 8 | ±1, ±1 | 3, 8, 14, 18, 23, 28, 33, 38 |
| 5 | 4, 9 | ±1, ±1 | 4, 9, 15, 19, 24, 29, 34, 39 |

One example of a watermarking scheme is given as follows. A watermark may be added to a fixed codebook (FCB) by limiting the pulse combinations allowed. Watermarking in an AMR 12.2 FCB may be accomplished in one configuration as follows. In each track, (pos0^pos1) & 001=1 watermarked bit, where the operator "^" refers to a logical exclusive or (XOR) operation, "&" refers to a logical AND operation and pos0 and post refer to indexes. Basically, the XOR of the last bit of the two indexes pos0 and pos1 may be constrained to be equal to the chosen bit of information to be transmitted (e.g., the watermark). This leads to one bit per track (e.g., five bits per subframe) providing 20 bits/frame=1 kbps. Alternatively, (pos0^pos1) & 011=2 watermarked bits, resulting in 2 kbps. For instance, the XOR of the two least significant bits (LSBs) of the indexes may be constrained to be the two bits of information to be transmitted. Watermarking may be added by limiting the searches in the AMR FCB search. For example, a search may be performed over pulse positions that will decode into the correct watermark. This approach may provide low complexity. Other approaches may be used in accordance with the systems and methods disclosed herein.

It should be noted that although a 12.2 kbps bit rate is given as an example herein, the systems and methods disclosed may be applied to other rates of eAMR. For example, one operating point of eAMR is 12.2 kbps. In one configuration of the systems and methods disclosed herein, lower rates may be used (e.g., switched to) in poor channel and/or poor network conditions. Thus, bandwidth switching (between narrowband and wideband, for example) may be a challenge. Wideband speech, for example, may be maintained with lower rates of eAMR. Each rate may use a watermarking scheme. For example, the watermarking scheme used for a 10.2 kbps rate may be similar to a scheme used for the 12.2 kbps rate. Table (2) illustrates examples of bit allocations per frame for differing rates. More specifically, Table (2) illustrates a number of bits per frame that may be allocated for communicating different types of information, such as Line Spectral Frequencies (LSF), gain shape, gain frame and Cyclic Redundancy Check (CRC).

TABLE 2

| Rate (kbps) | 12.2 | 10.2 | 7.95 | 7.4 | 6.7 | 5.9 | 5.15 | 4.75 |
|---|---|---|---|---|---|---|---|---|
| LSF | 8 | 8 | 8 | 8 | 4 | 4 | 4 | 4 |
| Gain Shape | 8 | 8 | 0 | 0 | 0 | 0 | 0 | 0 |
| Gain Frame | 4 | 4 | 4 | 4 | 4 | 4 | 4 | 4 |
| CRC | 4 | 4 | 4 | 4 | 4 | 4 | 4 | 4 |
| Total | 24 | 24 | 16 | 16 | 12 | 12 | 12 | 12 |

One configuration of the systems and methods disclosed herein may be used for the extension of code-excited linear prediction (CELP) speech coders using watermarking techniques to embed data. Wideband (e.g., 0-7 kilohertz (kHz)) coding of speech provides superior quality to narrowband (e.g., 0-4 kHz) coding of speech. However, the majority of existing mobile communication networks support narrowband coding only (e.g., adaptive multi-rate narrowband (AMR-NB)). Deploying wideband coders (e.g., adaptive multi-rate wideband (AMR-WB)) may require substantial and costly changes to infrastructure and service deployment.

Furthermore, the next generation of services may support wideband coders (e.g., AMR-WB), while super-wideband (e.g., 0-14 kHz) coders are being developed and standardized. Again, operators may eventually face the costs of deploying yet another codec to move customers to super-wideband.

One configuration of the systems and methods disclosed herein may use an advanced model that can encode additional bandwidth very efficiently and hide this information in a bitstream already supported by existing network infrastructure. The information hiding may be performed by watermarking the bitstream. One example of this technique watermarks the fixed codebook of a CELP coder. For example, the upper band of a wideband input (e.g., 4-7 kHz) may be encoded and carried as a watermark in a narrowband coder's bitstream. In another example, the upper band of a super-wideband input (e.g., 7-14 kHz) may be encoded and carried as a watermark in a wideband coder's bitstream. Other secondary bitstreams, perhaps unrelated to bandwidth extension, may be carried as well. This technique allows the encoder to produce a bitstream compatible with existing infrastructures. A legacy decoder may produce a narrowband output with a quality similar to standard encoded speech (without the watermark, for example), while a decoder that is aware of the watermark may produce wideband speech.

Various configurations are now described with reference to the Figures, where like reference numbers may indicate functionally similar elements. The systems and methods as generally described and illustrated in the Figures herein could be arranged and designed in a wide variety of different configurations. Thus, the following more detailed description of several configurations, as represented in the Figures, is not intended to limit scope, as claimed, but is merely representative of the systems and methods.

FIG. 1 is a block diagram illustrating one configuration of electronic devices 102, 134 in which systems and methods for encoding and detecting a watermarked signal may be implemented. Examples of electronic device A 102 and electronic device B 134 may include wireless communication devices (e.g., cellular phones, smart phones, personal digital assistants (PDAs), laptop computers, e-readers, etc.) and other devices.

Electronic device A 102 may include an encoder block/module 110 and/or a communication interface 124. The encoder block/module 110 may be used to encode and watermark a signal. The communication interface 124 may transmit one or more signals to another device (e.g., electronic device B 134).

Electronic device A 102 may obtain one or more signals A 104, such as audio or speech signals. For example, electronic device A 102 may capture signal A 104 using a microphone or may receive signal A 104 from another device (e.g., a Bluetooth headset). In some configurations, signal A 104 may be divided into different component signals (e.g., a higher frequency component signal and a lower frequency component signal, a monophonic signal and a stereo signal, etc.). In other configurations, unrelated signals A 104 may be obtained. Signal(s) A 104 may be provided to modeler circuitry 112 and coder circuitry 118 in an encoder 110. For example, a first signal 106 (e.g., signal component) may be provided to the modeler circuitry 112, while a second signal 108 (e.g., another signal component) is provided to the coder circuitry 118.

It should be noted that one or more of the elements included in electronic device A 102 may be implemented in hardware (e.g., circuitry), software or a combination of both. For instance, the term "circuitry" as used herein may indicate that an element may be implemented using one or more circuit components (e.g., transistors, resistors, registers, inductors, capacitors, etc.), including processing blocks and/or memory cells. Thus, one or more of the elements included in electronic device A 102 may be implemented as one or more integrated circuits, application specific integrated circuits (ASICs), etc., and/or using a processor and instructions. It should also be noted that the term "block/module" may be used to indicate that an element may be implemented in hardware, software or a combination of both.

The coder circuitry 118 may perform coding on the second signal 108. For example, the coder circuitry 118 may perform adaptive multi-rate (AMR) coding on the second signal 108. For instance, the coder circuitry 118 may produce a coded bitstream that watermark data with error check coding 162 may be embedded into. In some configurations, encoding the second signal 108 and embedding the watermark data with error check coding 162 into the second signal 108 may be performed concurrently. In other configurations, encoding the second signal 108 and embedding the watermark data with error check coding 162 into the second signal 108 may be performed sequentially.

The modeler circuitry 112 may determine watermark data 116 (e.g., parameters, bits, etc.) based on the first signal 106 that may be embedded into the second signal 108 (e.g., "carrier" signal). For example, the modeler circuitry 112 may separately encode the first signal 106 into watermark data 116 that can be embedded into the coded bitstream. In yet another example, the modeler circuitry 112 may provide bits from the first signal 106 (without modification) as watermark data 116. In another example, the modeler circuitry 112 may provide parameters (e.g., high band bits) as watermark data 116.

The watermark data 116 may be provided to watermark error check coding circuitry 120. The watermark error check coding circuitry 120 may add an error check code to the watermark data 116 to produce watermark data with error check coding 162. One example of an error check code that may be used in accordance with the systems and methods disclosed herein is a cyclic redundancy check (CRC) code. It should be noted that other kinds of error check codes or error checking techniques (e.g., repetition codes, parity bits, checksums, hash functions, etc.) may be used in accordance with the systems and methods disclosed herein. The error check coding added to the watermark data 116 may allow a decoder to detect the presence of an embedded watermark (over multiple frames, for example). In some configurations, the error check coding added to the watermark data 116 by the watermark error check coding circuitry 120 may be specific to (e.g., only applicable to) the watermark data 116. The watermark data with error check coding 162 may be provided to the coder circuitry 118. As described above, the coder circuitry 118 may embed the watermark data with error check coding 162 into the second signal 108 to produce a watermarked second signal 122. In other words, the coded second signal 108 with the embedded watermark signal may be referred to as a watermarked second signal 122.

The coder circuitry 118 may code (e.g., encode) the second signal 108. In some configurations, this coding may produce data 114, which may be provided to the modeler circuitry 112. In one configuration, the modeler circuitry 112 may use an enhanced variable rate codec—wideband (EVRC-WB) model to model higher frequency components (from the first signal 106) that relies on lower frequency components (from the second signal 108) that may be encoded by the coder circuitry 118. Thus, the data 114 may be provided to the modeler circuitry 112 for use in modeling the higher frequency components. The resulting higher frequency component watermark data 116 (with error check coding 162) may then be embedded into the second signal 108 by the coder circuitry 118, thereby producing the watermarked second signal 122.

It should be noted that the watermarking process may alter some of the bits of an encoded second signal 108. For example, the second signal 108 may be referred to as a "carrier" signal or bitstream. In the watermarking process, some of the bits that make up the encoded second signal 108 may be altered in order to embed or insert the watermark data 116 (with error check coding 162) derived from the first signal 106 into the second signal 108 to produce the watermarked second signal 122. In some cases, this may be a source of degradation in the encoded second signal 108. However, this approach may be advantageous since decoders that are not designed to extract the watermark information may still recover a version of the second signal 108, without the extra information provided by the first signal 106. Thus, "legacy" devices and infrastructure may still function regardless of the watermarking. This approach further allows other decoders (that are designed to extract the watermark information) to be used to extract the additional watermark information provided by the first signal 106.

The watermarked second signal 122 (e.g., bitstream) may be provided to the communication interface 124. Examples of the communication interface 124 may include transceivers, network cards, wireless modems, etc. The communication interface 124 may be used to communicate (e.g., transmit) the watermarked second signal 122 to another device, such as electronic device B 134 over a network 128. For example, the communication interface 124 may be based on wired and/or wireless technology. Some operations performed by the communication interface 124 may include modulation, formatting (e.g., packetizing, interleaving, scrambling, etc.), upconversion, amplification, etc. Thus, electronic device A 102 may transmit a signal 126 that comprises the watermarked second signal 122.

The signal 126 (including the watermarked second signal 122) may be sent to one or more network devices 130. For example, a network 128 may include the one or more network devices 130 and/or transmission mediums for communicating signals between devices (e.g., between electronic device A 102 and electronic device B 134). In the configuration illustrated in FIG. 1, the network 128 includes one or more network devices 130. Examples of network devices 130 include base stations, routers, servers, bridges, gateways, etc.

In some cases, one or more network devices 130 may transcode the signal 126 (that includes the watermarked second signal 122). Transcoding may include decoding the transmitted signal 126 and re-encoding it (into another format, for example). In some cases, transcoding the signal 126 may destroy the watermark information embedded in the signal 126. In such a case, electronic device B 134 may receive a signal that no longer contains the watermark information.

Other network devices 130 may not use any transcoding. For instance, if a network 128 uses devices that do not transcode signals, the network 128 may provide tandem-free/transcoder-free operation (TFO/TrFO). In this case, the watermark information embedded in the watermarked second signal 122 may be preserved as it is sent to another device (e.g., electronic device B 134).

Electronic device B 134 may receive a signal 132 (via the network 128), such as a signal 132 having watermark information preserved or a signal 132 without watermark information. For instance, electronic device B 134 may receive a signal 132 using a communication interface 136. Examples of the communication interface 136 may include transceivers, network cards, wireless modems, etc. The communication interface 136 may perform operations such as downconversion, synchronization, deformatting (e.g., de-packetizing, unscrambling, de-interleaving, etc.) and/or channel decoding on the signal 132 to extract a received bitstream 138. The received bitstream 138 (which may or may not be a watermarked bitstream) may be provided to a decoder block/module 140. For example, the received bitstream 138 may be provided to modeler circuitry 142, to watermark detection circuitry 152 and/or to decoder circuitry 150.

The decoder block/module 140 may include modeler circuitry 142, watermark detection circuitry 152, mode selection circuitry 166 and/or decoder circuitry 150. The decoder block/module 140 may optionally include combining circuitry 146. The watermark detection circuitry 152 may be used to determine whether or not watermark information (e.g., watermark data with error check coding 162) is embedded in the received bitstream 138. In one configuration, the watermark detection circuitry 152 may include a watermark error checking block/module 164. The watermark error checking block/module 164 may use an error check code (e.g., 4-bit CRC in multiple frames) to determine whether watermark information is embedded in the received bitstream 138. In one configuration, the watermark detection circuitry 152 may use an averaging scheme where if a certain number of CRC codes (e.g., 7) are correctly received within multiple frames (e.g., a number of consecutive frames such as 12), then the watermark detection circuitry 152 may determine that watermark information is embedded on the received bitstream 138. This approach may reduce the risk of false positive indicators, where watermark decoding would be performed when no watermark information was actually embedded in the received signal. In some configurations, the watermark error checking block/module 164 may additionally or alternatively be used to determine whether a watermarked frame was received in error (in order to conceal the error, for example).

The watermark detection circuitry 152 may produce a watermark indicator 144 based on its 152 determination of whether or not the received bitstream 138 includes watermark information (e.g., watermark data with error check coding 162). For example, if the watermark detection circuitry 152 determines that watermark information is embedded in the received bitstream 138, then the watermark indicator 144 may so indicate. The watermark indicator 144 may be provided to the mode selection circuitry 166.

The mode selection circuitry 166 may be used to switch the decoder block/module 140 between decoding modes. For example, the mode selection circuitry 166 may switch between a conventional decoding mode (e.g., legacy decoding mode) and a watermark decoding mode (e.g., enhanced decoding mode). While in the conventional decoding mode, the decoder block/module 140 may only produce a decoded second signal 158 (e.g., a recovered version of the second signal 108). Furthermore, in the conventional decoding mode, the decoder block/module 140 may not attempt to extract any watermark information from the received bitstream 138. While in the watermark decoding mode, however, the decoder block/module 140 may produce a decoded first signal 154. For example, the decoder block/module 140 may extract, model and/or decode watermark information embedded in the received bitstream 138 while in the watermark decoding mode.

The mode selection circuitry 166 may provide a mode indicator 148 to the modeler circuitry 142. For instance, if the watermark detection circuitry 152 indicates that watermark information is embedded in the received bitstream 138, the mode indicator 148 provided by the mode selection circuitry 166 may cause the modeler circuitry 142 to model and/or decode the watermark information (e.g., watermarked bits) embedded in the received bitstream 138. In some cases, the mode indicator 148 may indicate that there is no watermark information in the received bitstream 138. This may cause the modeler circuitry 142 to not model and/or decode.

The modeler circuitry 142 may extract, model and/or decode watermark information or data from the received bitstream 138. For example, the modeling/decoding block/module may extract, model and/or decode watermark data from the received bitstream 138 to produce a decoded first signal 154.

The decoder circuitry 150 may decode the received bitstream 138. In some configurations, the decoder circuitry 150 may use a "legacy" decoder (e.g., a standard narrowband decoder) or decoding procedure that decodes the received bitstream 138 regardless of any watermark information that may or may not be included in the received bitstream 138. The decoder circuitry 150 may produce a decoded second signal 158. Thus, for example, if no watermark information is included in the received bitstream 138, the decoder circuitry 150 may still recover a version of the second signal 108, which is the decoded second signal 158.

In some configurations, the operations performed by the modeler circuitry 142 may depend on operations performed by the decoder circuitry 150. For example, a model (e.g., EVRC-WB) used for a higher frequency band may depend on a decoded narrowband signal (e.g., the decoded second signal 158 decoded using AMR-NB). In this case, the decoded second signal 158 may be provided to the modeler circuitry 142.

In some configurations, a decoded second signal 158 may be combined with a decoded first signal 154 by combining circuitry 146 to produce a combined signal 156. In other configurations, the watermark data from the received bitstream 138 and the received bitstream 138 may be decoded separately to produce the decoded first signal 154 and the decoded second signal 158. Thus, one or more signals B 160 may include a decoded first signal 154 and a separate decoded second signal 158 and/or may include a combined signal 156. It should be noted that the decoded first signal 154 may be a decoded version of the first signal 106 encoded by electronic device A 102. Additionally or alternatively, the decoded second signal 158 may be a decoded version of the second signal 108 encoded by electronic device A 102.

In some configurations, the mode selection circuitry 166 may provide the mode indicator 148 to the combining circuitry 146. For example, in a configuration where the decoded first signal 154 and the decoded second signal 158 may be combined, the mode indicator 148 may cause the combining circuitry 146 to combine the decoded first signal 154 and the decoded second signal 158 according to a watermark or enhanced decoding mode. However, if watermark data or information is not detected in the received bitstream, the mode indicator 148 may cause the combining circuitry 146 to not combine signals. In that case, the decoder circuitry 150 may provide the decoded second signal 158 according to a conventional or legacy decoding mode.

If no watermark information is embedded in the received bitstream 138, the decoder circuitry 150 may decode the received bitstream 138 (in a legacy mode, for example) to produce the decoded second signal 158. This may provide a decoded second signal 158, without the additional information provided by the first signal 106. This may occur, for example, if the watermark information (from the first signal 106, for example) is destroyed in a transcoding operation in the network 128.

In some configurations, electronic device B 134 may be incapable of decoding the watermark data embedded in the received bitstream 138. For example, electronic device B 134 may not include modeler circuitry 142 for extracting the embedded watermark data in some configurations. In such a case, electronic device B 134 may simply decode the received bitstream 138 to produce the decoded second signal 158.

It should be noted that one or more of the elements included in electronic device B 134 may be implemented in hardware (e.g., circuitry), software or a combination of both. For instance, one or more of the elements included in electronic device B 134 may be implemented as one or more integrated circuits, application specific integrated circuits (ASICs), etc., and/or using a processor and instructions.

In some configurations, an electronic device (e.g., electronic device A 102, electronic device B 134, etc.) may include both an encoder and a decoder for encoding a watermarked signal and/or decoding an encoded watermarked signal. For instance, electronic device A 102 may include both the encoder 110 and a decoder similar to the decoder 140 included in electronic device B 134. In some configurations, both the encoder 110 and a decoder similar to the decoder 140 included in electronic device B 134 may be included in a codec. Thus, a single electronic device may be configured to both produce encoded watermarked signals and to decode encoded watermarked signals.

It should be noted that the watermarked second signal 122 may not necessarily be transmitted to another electronic device in some configurations and/or instances. For example, electronic device A 102 may instead store the watermarked second signal 122 for later access (e.g., decoding, playback, etc.).

Figure 2:
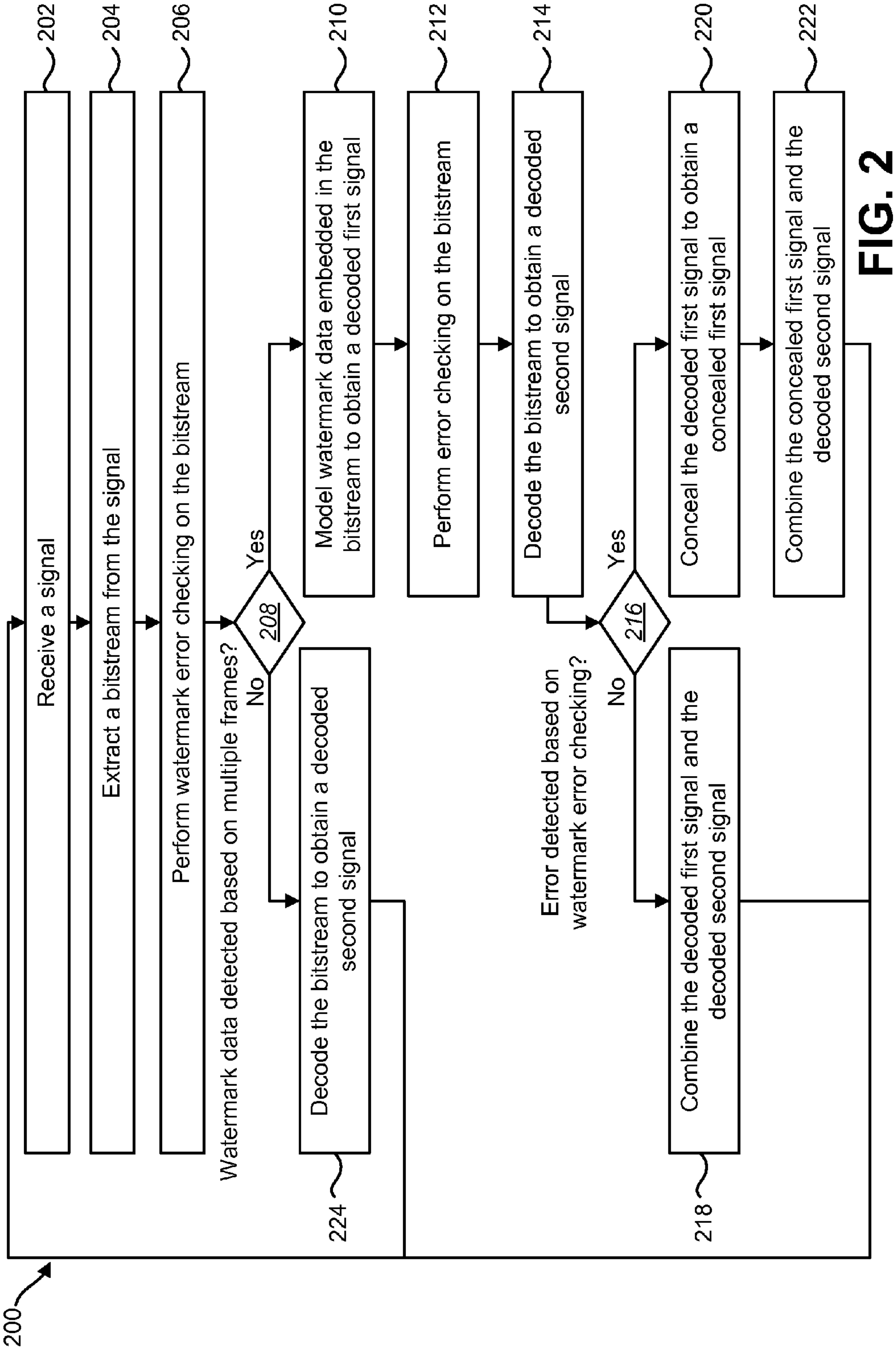
FIG. 2 is a flow diagram illustrating one configuration of a method for decoding a signal.

FIG. 2 is a flow diagram illustrating one configuration of a method 200 for decoding a signal. An electronic device 134 (e.g., wireless communication device) may receive 202 a signal 132. For example, the electronic device 134 may receive 202 a signal 132 using one or more antennas and a receiver. The electronic device 134 may extract 204 a bitstream 138 (e.g., a compressed speech bitstream) from the signal 132. For example, the electronic device 134 may amplify, demodulate, channel decode, deformat and/or synchronize, etc., the signal 132 in order to extract 204 the bitstream 138 from the signal 132.

The electronic device 134 may perform 206 watermark error checking on the bitstream 138. For example, the electronic device 134 may attempt to read cyclic redundancy check (CRC) error bits to see if they correctly correspond to the bitstream 138. In one configuration, the error checking may be performed for multiple frames (e.g., packets). For example, the electronic device 134 may determine whether error check bits over multiple frames indicate an error or not (e.g., whether they correctly correspond to received data, such as CRC bits). The systems and methods disclosed herein may spread the error checking over several frames, which provides a reliable decision while reducing the overhead (e.g., only 4 bits per frame in one example). This comes at the cost of a slightly slower adaptation time (as several frames need to be accumulated before detecting a change in conditions).

It should be noted that performing 206 watermark error checking may include performing 206 error checking on certain bits included in the bitstream 138. For example, the bitstream 138 may include some bits that may be used for watermarking. However, some bits may not be used for watermarking. Thus, the electronic device 134 may perform 206 error checking on those bits that are used for embedding watermark data.

It should also be noted that the watermark error checking performed 206 may be specific to watermark data that may or may not be embedded in the bitstream 138. For example, the electronic device 134 may perform 206 watermark error checking only on bits that are assigned for watermarking data, whether or not the watermarking data is actually embedded in the bitstream. This watermark error checking may only be applicable to bits that may include watermarking data. In one configuration, each frame (e.g., packet) of data in the received bitstream 138 may have a number of bits (e.g., four) assigned for a cyclic redundancy check (CRC) of watermark bits that are possibly embedded in the bitstream 138.

The electronic device 134 may determine 208 whether watermark data is detected based on the watermark error checking for multiple frames. For example, if the electronic device 134 determines that more than a number M (e.g., M=7) of error check codes (e.g., cyclic redundancy check (CRC) codes) indicate correct data reception within a number N of frames (e.g., N=12), the electronic device 134 may determine 208 that watermark data is detected. However, if fewer than the designated number of CRC codes are incorrectly received within the number of frames (e.g., multiple and/or consecutive frames), the electronic device 134 may determine that no watermark data is embedded within the bitstream 138.

The systems and methods disclosed herein may allow for one or more approaches to be used when determining 208 whether watermark data is detected based on the watermark error checking. For example, the N frames used may include consecutive and/or non-consecutive frames. In one configuration, the N frames may be consecutive. In another configuration, the N frames may not be consecutive. For example, the N frames may include every other frame in a group of frames. For instance, N=12 frames out of 24 frames may be used to determine 208 whether watermark data is detected. Other groupings of a number N of frames may be used. In some configurations, each frame (e.g., the watermark data in each frame) may be temporally distinct. For example, each frame may include data, watermark data and/or error check coding that was obtained and/or generated at a different time. For instance, each frame of watermark data may represent temporally distinct portions of an audio signal.

In some configurations, this determination 208 may be cumulative. For example, the determination 208 that watermark data is detected based on N frames may be applied to all of the N frames. For instance, if more than M of N frames indicate correct reception (of watermark data), then the electronic device 134 may determine 208 that all of the N frames include watermark data. In one sense, a determination or decision by the electronic device 134 regarding whether watermark data corresponding to the error check code was correctly received from each of the N frames may be combined to make a cumulative determination 208 on the existence of watermark data in all N frames, for example. More specifically, determining 208 whether watermark data is included in all N frames may be based on combining error check decisions from temporally distinct frames.

In some configurations of the systems and methods herein, determining 208 whether watermark data is detected may be performed in real time. For example, watermark data detection may only be determined 208 once for a group of frames or a period of time in the bitstream. In this example, the electronic device 134 may check CRC codes in N frames once. If it is determined 208 that watermark data is not detected, for instance, then the electronic device 134 may not perform additional operations to determine 208 whether the watermark data is detected for that corresponding group of frames. Rather, the electronic device 134 may proceed to determine 208 whether watermark data is detected for another group of frames.

If no watermark data is detected, the electronic device 134 may decode 224 the bitstream 138 to obtain a decoded second signal 158. For example, the electronic device 134 may decode 224 the bitstream 138 using conventional or legacy decoding (e.g., AMR narrowband decoding) to produce the decoded second signal 158. The electronic device 134 may then return to receiving 202 a signal 132.

If watermark data is detected, the electronic device 134 may model 210 (e.g., decode) the watermark data embedded in the bitstream 138 to obtain a decoded first signal 154. For example, the electronic device 134 may model 210 (e.g., decode) the watermark data using an EVRC-WB model to obtain the decoded first signal 154.

The electronic device 134 may optionally perform 212 error checking on the bitstream 138. For example, the electronic device 134 may perform error checking using an error checking mechanism such as a cyclic redundancy check (CRC). For instance, performing 212 error checking may include error checking on the bitstream 138 regardless of any watermark data that may or may not be embedded in the bitstream. In other words, the error checking performed 212 on the bitstream 138 may not be specific to any possible watermark data, but may be applicable to non-watermark data (in addition to or alternatively from possible watermark data). In some configurations, the error checking may be performed according to a conventional codec used.

The electronic device 134 may decode 214 the bitstream to obtain a decoded second signal 158. For example, the electronic device 134 may decode 224 the bitstream 138 using conventional or legacy decoding (e.g., AMR narrowband decoding) to produce the decoded second signal 158.

The electronic device 134 may optionally determine 216 whether an error is detected based on the watermark error checking. For example, this may be based on the watermark error checking performed 206. For instance, if a cyclic redundancy check (CRC) code for bits corresponding to possible watermark data does not correctly correspond to the received information, the electronic device 134 may determine 216 that an error has been detected. In some configurations, this determination 216 may be additionally or alternatively based on the optionally performed 212 error check. For example, the electronic device 134 may determine 216 whether an error is detected based on error checking for the bitstream 138 as a whole in addition to or alternatively from the error checking that is specific to possible watermark data.

If no error is detected, the electronic device 134 may optionally combine 218 the decoded first signal 154 and the decoded second signal 158. For instance, the decoded first signal 154 may contain high frequency components of a speech signal, while the decoded second signal 158 may contain lower frequency components of the speech signal. In this example, the electronic device 134 may synthesize or combine 218 the higher and lower frequency components into a combined signal 156. In one configuration, the electronic device 134 may use a synthesis filter bank to combine 218 the decoded first signal 154 and the decoded second signal 158. The electronic device 134 may then return to receiving 202 a signal.

If an error is detected, the electronic device 134 may optionally conceal 220 the decoded first signal 154 to obtain a concealed first signal (e.g., error concealment output). This may be accomplished by extrapolating signal information from recently received information that was correctly decoded, for example. For instance, the electronic device 134 may extrapolate signal information from recently modeled or decoded first signal 154. In some configurations, the extrapolated signal information may replace and/or be combined with the decoded first signal 154.

The electronic device 134 may then optionally combine 222 the concealed first signal (e.g., error concealment output) and the decoded second signal 158 to obtain a combined signal 156. In one configuration, the electronic device 134 may use a synthesis filter bank to combine 222 the concealed first signal and the decoded second signal 158 to obtain the combined signal 156. The electronic device 134 may then return to receiving 202 a signal.

Figure 3:
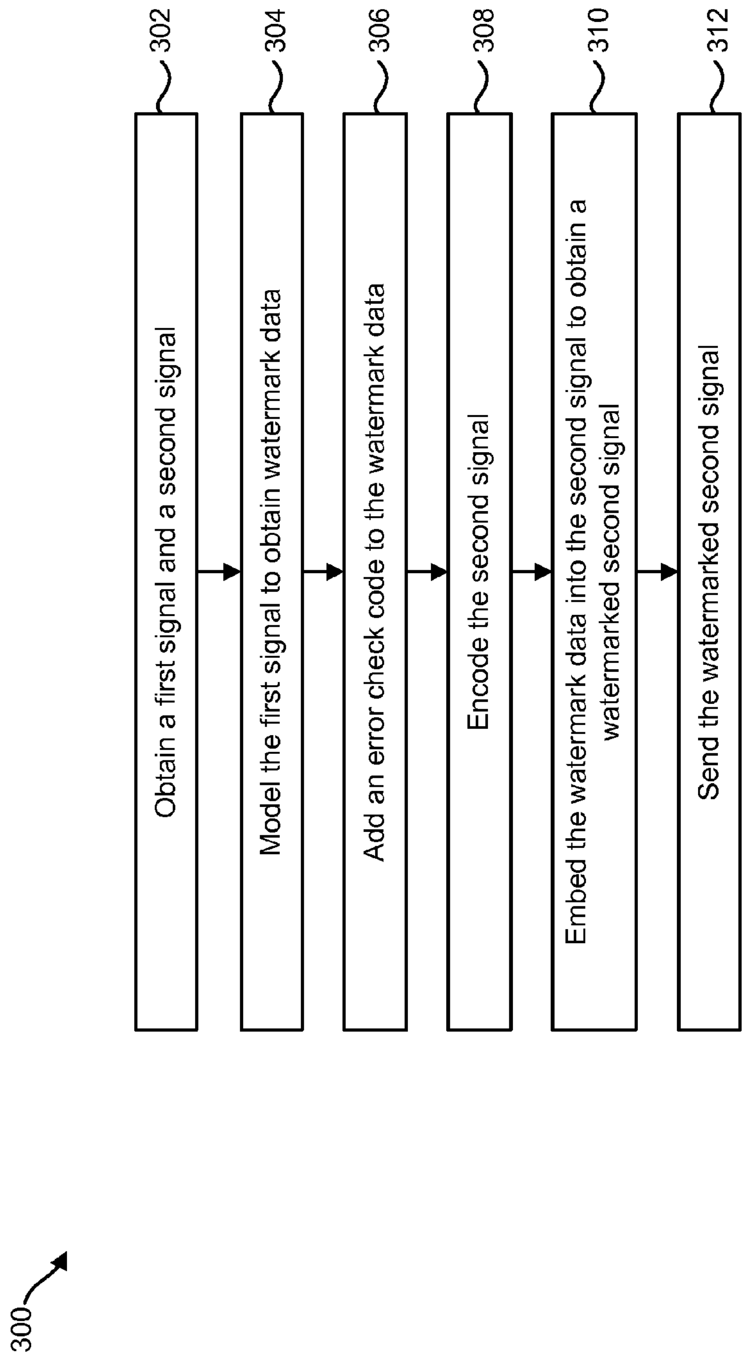
FIG. 3 is a flow diagram illustrating one configuration of a method for encoding a watermarked signal.

FIG. 3 is a flow diagram illustrating one configuration of a method 300 for encoding a watermarked signal. An electronic device 102 may obtain 302 a first signal 106 and a second signal 108. In some configurations, the electronic device 102 (e.g., wireless communication device) may divide a signal 104 into the first signal 106 and the second signal 108. This may be done, for example, when high and low frequency components of a speech signal 104 are to be encoded as a watermarked second signal 122. In that case, the lower frequency components (e.g., the second signal 108) may be encoded (e.g., conventionally encoded or encoded using a legacy encoding) and the higher frequency components (e.g., the first signal 106) may be modeled (e.g., encoded) and embedded on the encoded second signal 108. In other configurations, the first signal 106 and the second signal 108 may be unrelated and/or separate, where the first signal 106 is modeled (e.g., encoded) and embedded within an encoded second signal 108 (e.g., "carrier" signal). For instance, the electronic device 102 may obtain 302 a first signal 106 and a second signal 108, where the first signal 106 is unrelated to the second signal 108.

The electronic device 102 may model 304 (e.g., encode) the first signal 106 to obtain watermark data 116. For example, the electronic device 102 may model 304 (e.g., encode) the first signal 106 into a number of bits. In one configuration, the electronic device 102 may model 304 the first signal 106 using an EVRC-WB model.

The electronic device 102 may add 306 an error check code to the watermark data 116. For example, the electronic device 102 may add 306 a cyclic redundancy check (CRC) code (e.g., 4-bit CRC per frame) to the watermark data 116. In other examples, the electronic device 102 may add 306 a repetition code, parity bits, checksums and/or use other error checking techniques. Adding the error check code to the watermark data 116 may result in watermark data with error check coding 162. The error check code may be used for watermarking detection and/or error checking. In some configurations, the error check code may be added to multiple frames of the watermark data 116.

The systems and methods disclosed herein may spread error check codes (e.g., CRC codes) across multiple and/or consecutive frames. This may be done such that the presence of watermark data in a bitstream 138 may be detected. For example, spreading error check codes across multiple frames may permit reliable detection of the presence of watermark data in a transmitted signal, even though the amount of error check code added to an individual frame may be insufficient to detect an error in the individual frame with high reliability. In one configuration, watermarking may be performed at a very low bit rate in order to reduce or minimize distortion. Thus, spreading the error checking may be useful in this context. The encoder block/module 110 may embed error checking (e.g., CRC) over multiple frames such that a decoder block/module 140 may detect the embedded watermark information. In some configurations, the electronic device 102 (e.g., encoder) may embed and/or send very small amounts of CRC code (spread over multiple frames), which may be much smaller than what would normally be needed for reliable error checking on individual frames. For example, the electronic device may add a proportion that is equal to or smaller than four bits of error checking per 20 information bits (per watermarked frame).

Additional detail regarding error checking is given hereafter. When using an error check code, there is no certainty from a mathematical point of view. For example, assume that R redundancy bits are used for each bit of information. With a bit error rate of x, there is an x^R chance that they have all been corrupted. This tends towards zero as R increases, but never reaches it. A 4-bit CRC has approximately 1 in 16 chances to be seen as correct, while it is in fact incorrect. The 4-bit CRC may be able to detect up to 4 bit errors in a message. Overall, spreading the CRC across several frames allows a lower number of bits for a given detection efficiency, at the cost of lower reactivity (e.g., it may take a few frames to detect the change between valid watermark to invalid, for example when leaving a network that offers TrFO). In some applications, however, this is a good trade-off as such changes may not happen often, and a few frames delay in the switch are unlikely to be very noticeable.

In one configuration, the electronic device 102 may add 306 an error check code (e.g., CRC) to multiple frames. For example, the electronic device 102 may add 306 four bits of CRC code to two or more of the multiple frames. In some configurations, the error check code in each frame may correspond to the watermark data 116 embedded in each frame of the watermarked second signal 122. For example, the electronic device 102 may add 306 error check code to consecutive and/or non-consecutive frames. The frames may be temporally distinct.

The electronic device 102 may encode 308 the second signal 108. For instance, the electronic device 102 may encode 308 the second signal 108 using adaptive multi-rate (AMR) coding. In some configurations, the encoding performed on the second signal 108 may be backwards compatible with legacy devices. For example, a receiving device that cannot extract watermark information may still be able to recover a version of the second signal 108.

The electronic device 102 may embed 310 the watermark data 116 (e.g., the watermark data with error check coding 162) into the second signal 108 to obtain a watermarked second signal 122. For example, the electronic device 102 may embed 310 the watermark data with error check coding 162 into the second signal 108 using a fixed codebook (FCB) by limiting the pulse combinations that are allowed. In this way, the electronic device 102 may embed 310 the watermark data 116 (e.g., bits) into the second signal 108. In some configurations, encoding 308 the second signal 108 and embedding 310 the watermark data into the second signal 108 may be performed concurrently. In other configurations, encoding 308 the second signal 108 and embedding 310 the watermark data into the second signal 108 may be performed sequentially.

The electronic device 102 may send 312 the watermarked second signal 122. For example, the electronic device 102 may transmit the watermarked second signal 122 that includes the watermark data with error check coding 162 and the second signal 108 to another device via a network 128.

Figure 4:
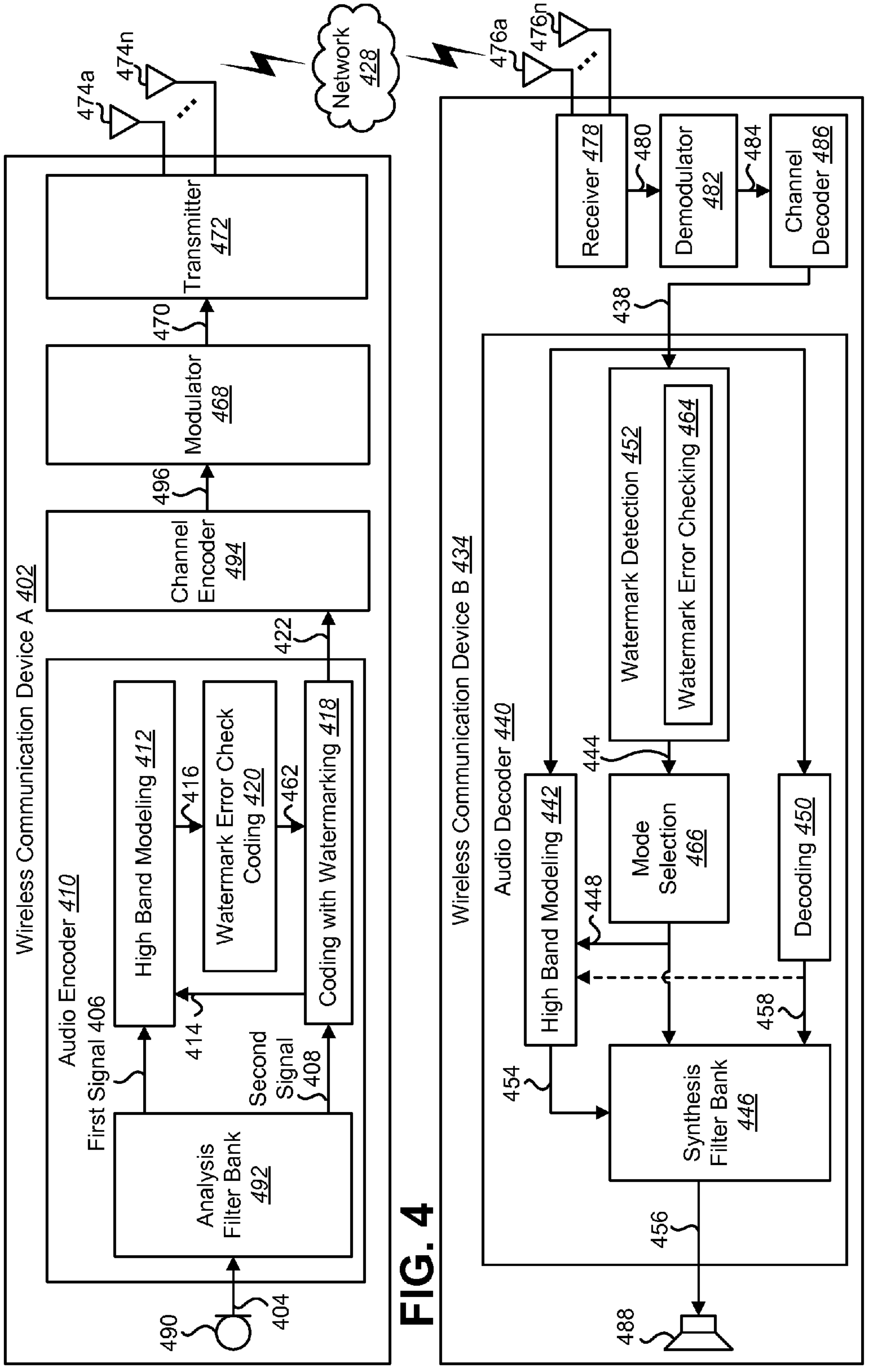
FIG. 4 is a block diagram illustrating one configuration of wireless communication devices in which systems and methods for encoding and detecting a watermarked signal may be implemented.

FIG. 4 is a block diagram illustrating one configuration of wireless communication devices 402, 434 in which systems and methods for encoding and detecting a watermarked signal may be implemented. Examples of wireless communication device A 402 and wireless communication device B 434 may include cellular phones, smart phones, personal digital assistants (PDAs), laptop computers, e-readers, etc.

Wireless communication device A 402 may include a microphone 490, an audio encoder 410, a channel encoder 494, a modulator 468, a transmitter 472 and one or more antennas 474*a-n*. The audio encoder 410 may be used for encoding and watermarking audio signals. The channel encoder 494, modulator 468, transmitter 472 and one or more antennas 474*a-n* may be used to prepare and transmit one or more signals to another device (e.g., wireless communication device B 434).

Wireless communication device A 402 may obtain an audio signal 404. For example, wireless communication device A 402 may capture the audio signal 404 (e.g., speech) using a microphone 490. The microphone 490 may convert an acoustic signal (e.g., sounds, speech, etc.) into the electrical or electronic audio signal 404. The audio signal 404 may be provided to the audio encoder 410, which may include an analysis filter bank 492, a high band modeling block/module 412, a watermark error check coding block/module 420 and a coding with watermarking block/module 418.

The audio signal 404 may be provided to the analysis filter bank 492. The analysis filter bank 492 may divide the audio signal 404 into a first signal 406 and a second signal 408. For example, the first signal 406 may be a higher frequency component signal and the second signal 408 may be a lower frequency component signal. The first signal 406 may be provided to the high band modeling block/module 412. The second signal 408 may be provided to the coding with watermarking block/module 418.

It should be noted that one or more of the elements (e.g., microphone 490, audio encoder 410, channel encoder 494, modulator 468, transmitter 472, etc.) included in wireless communication device A 402 may be implemented in hardware, software or a combination of both. For instance, one or more of the elements included in wireless communication device A 402 may be implemented as one or more integrated circuits, application specific integrated circuits (ASICs), etc., and/or using a processor and instructions. It should also be noted that the term "block/module" may also be used to indicate that an element may be implemented in hardware, software or a combination of both.

The coding with watermarking block/module 418 may perform coding on the second signal 408. For example, the coding with watermarking block/module 418 may perform adaptive multi-rate (AMR) coding on the second signal 408. The high band modeling block/module 412 may determine watermark data 416. The watermark data 416 may be provided to the watermark error check coding block/module 420. The watermark error check coding block/module 420 may add error check coding to the watermark data 416 to produce watermark data with error check coding 462. In some configurations, the error check coding added to the watermark data 416 by the watermark error check coding block/module 420 may be specific to (e.g., only applicable to) the watermark data 416. The watermark data with error check coding 462 may be embedded into the second signal 408 (e.g., "carrier" signal). For example, the coding with watermarking block/module 418 may produce a coded bitstream that watermark bits (e.g., watermark data with error check coding 462) may be embedded into. The coded second signal 408 with the embedded watermark information may be referred to as a watermarked second signal 422.

The coding with watermarking block/module 418 may code (e.g., encode) the second signal 408. In some configurations, this coding may produce data 414, which may be provided to the high band modeling block/module 412. In one configuration, the high band modeling block/module 412 may use an EVRC-WB model to model higher frequency components (from the first signal 406) that relies on lower frequency components (from the second signal 408) that may be encoded by the coding with watermarking block/module 418. Thus, the data 414 may be provided to the high band modeling block/module 412 for use in modeling the higher frequency components.

The resulting higher frequency component watermark data 416 may then be provided to the watermark error check coding block/module 420. The watermark error check coding block/module 420 may add an error check code to the watermark data 416 to produce watermark data with error check coding 462. One example of an error check code that may be used in accordance with the systems and methods disclosed herein is a cyclic redundancy check (CRC) code. The error check coding added to the watermark data 416 may allow a decoder to detect the presence of an embedded watermark (over multiple frames, for example). In one configuration, the watermark error check coding block/module 420 may add four bits of error check code to each frame of watermark data 416. The watermark data with error check coding 462 may be provided to the coding with watermarking block/module 418.

The watermark data with error check coding 462 may be embedded into the second signal 408 by the coding with watermarking block/module 418, thereby producing the watermarked second signal 422. Embedding the watermark data 416 (e.g., high band bits with error check coding) may involve the use of a watermarking codebook (e.g., fixed codebook or FCB) to embed the watermark data 416 into the second signal 408 to produce the watermarked second signal 422 (e.g., a watermarked bitstream).

It should be noted that the watermarking process may alter some of the bits of an encoded second signal 408. For example, the second signal 408 may be referred to as a "carrier" signal or bitstream. In the watermarking process, some of the bits that make up the encoded second signal 408 may be altered in order to embed or insert the watermark data with error check coding 462 derived from the first signal 406 into the second signal 408 to produce the watermarked second signal 422. In some cases, this may be a source of degradation in the encoded second signal 408. However, this approach may be advantageous since decoders that are not designed to extract the watermark information may still recover a version of the second signal 408, without the extra information provided by the first signal 406. Thus, "legacy" devices and infrastructure may still function regardless of the watermarking. This approach further allows other decoders (that are designed to extract the watermark information) to be used to extract the additional watermark information provided by the first signal 406.

The watermarked second signal (e.g., bitstream) 422 may be provided to the channel encoder 494. The channel encoder 494 may encode the watermarked second signal 422 to produce a channel-encoded signal 496. For example, the channel encoder 494 may add error detection coding (e.g., a cyclic redundancy check (CRC)) and/or error correction coding (e.g., forward error correction (FEC) coding) to the watermarked second signal 422.

The channel-encoded signal 496 may be provided to the modulator 468. The modulator 468 may modulate the channel-encoded signal 496 to produce a modulated signal 470. For example, the modulator 468 may map bits in the channel-encoded signal 496 to constellation points. For instance, the modulator 468 may apply a modulation scheme to the channel-encoded signal 496 such as binary phase-shift keying (BPSK), quadrature amplitude modulation (QAM), frequency-shift keying (FSK), etc., to produce the modulated signal 470.

The modulated signal 470 may be provided to the transmitter 472. The transmitter 472 may transmit the modulated signal 470 using the one or more antennas 474*a-n*. For example, the transmitter 472 may upconvert, amplify and transmit the modulated signal 470 using the one or more antennas 474*a-n*.

The modulated signal 470 that includes the watermarked second signal 422 (e.g., a "transmitted signal") may be transmitted from wireless communication device A 402 to another device (e.g., wireless communication device B 434) over a network 428. The network 428 may include the one or more network 428 devices and/or transmission mediums for communicating signals between devices (e.g., between wireless communication device A 402 and wireless communication device B 434). For example, the network 428 may include one or more base stations, routers, servers, bridges, gateways, etc.

In some cases, one or more network 428 devices may transcode the transmitted signal (that includes the watermarked second signal 422). Transcoding may include decoding the transmitted signal and re-encoding it (into another format, for example). In some cases, transcoding may destroy the watermark information embedded in the transmitted signal. In such a case, wireless communication device B 434 may receive a signal that no longer contains the watermark information. Other network 428 devices may not use any transcoding. For instance, if a network 428 uses devices that do not transcode signals, the network may provide tandem-free/transcoder-free operation (TFO/TrFO). In this case, the watermark information embedded in the watermarked second signal 422 may be preserved as it is sent to another device (e.g., wireless communication device B 434).

Wireless communication device B 434 may receive a signal (via the network 428), such as a signal having watermark information preserved or a signal without watermark information. For instance, wireless communication device B 434 may receive a signal using one or more antennas 476*a-n* and a receiver 478. In one configuration, the receiver 478 may downconvert and digitize the signal to produce a received signal 480.

The received signal 480 may be provided to a demodulator 482. The demodulator 482 may demodulate the received signal 480 to produce a demodulated signal 484, which may be provided to a channel decoder 486. The channel decoder 486 may decode the signal (e.g., detect and/or correct errors using error detection and/or correction codes) to produce a (decoded) received bitstream 438.

The received bitstream 438 may be provided to an audio decoder 440. For example, the received bitstream 438 may be provided to a high band modeling block/module 442, to a watermark detection block/module 452 and to a decoding block/module 450.

The audio decoder 440 may include a high band modeling block/module 442, a watermark detection block/module 452, a mode selection block/module 466 and/or a decoding block/module 450. The audio decoder 440 may optionally include a synthesis filter bank 446. The watermark detection block/module 452 may be used to determine whether or not watermark information (e.g., watermark data with error check coding 462) is embedded in the received bitstream 438. In one configuration, the watermark detection block/module 452 may include a watermark error checking block/module 464. The watermark error checking block/module 464 may use an error check code (e.g., 4-bit CRC in multiple frames) to determine whether watermark information is embedded in the received bitstream 438. In one configuration, the watermark detection block/module 452 may use an averaging scheme where if a certain number of CRC codes (e.g., 7) are correctly received within multiple frames (e.g., a number of consecutive frames such as 12), then the watermark detection block/module 452 may determine that watermark information is embedded on the received bitstream 438. This approach may reduce the risk of false positive indicators, where watermark decoding would be performed when no watermark information was actually embedded in the received signal. In some configurations, the watermark error checking block/module 464 may additionally or alternatively be used to determine whether a watermarked frame was received in error (in order to conceal the error, for example).

The watermark detection block/module 452 may produce a watermark indicator 444 based on its 452 determination of whether or not the received bitstream 438 includes watermark information (e.g., watermark data with error check coding 462). For example, if the watermark detection block/module 452 determines that watermark information is embedded in the received bitstream 438, then the watermark indicator 444 may so indicate. The watermark indicator 444 may be provided to the mode selection block/module 466.

The mode selection block/module 466 may be used to switch the audio decoder 440 between decoding modes. For example, the mode selection block/module 466 may switch between a conventional decoding mode (e.g., legacy decoding mode) and a watermark decoding mode (e.g., enhanced decoding mode). While in the conventional decoding mode, the audio decoder 440 may only produce a decoded second signal 458 (e.g., a recovered version of the second signal 408). Furthermore, in the conventional decoding mode, the audio decoder 440 may not attempt to extract any watermark information from the received bitstream 438. While in the watermark decoding mode, however, the audio decoder 440 may produce a decoded first signal 454. For example, the audio decoder 440 may extract, model and/or decode watermark information embedded in the received bitstream 438 while in the watermark decoding mode.

The mode selection block/module 466 may provide a mode indicator 448 to the high band modeling block/module 442. For instance, if the watermark detection block/module 452 indicates that watermark information is embedded in the received bitstream 438, the mode indicator 448 provided by the mode selection block/module 466 may cause the high band modeling block/module 442 to model and/or decode the watermark information (e.g., watermarked bits) embedded in the received bitstream 438. In some cases, the mode indicator 448 may indicate that there is no watermark information in the received bitstream 438. This may cause the high band modeling block/module 442 to not model and/or decode.

The decoding block/module 450 may decode the received bitstream 438. In some configurations, the decoding block/module 450 may use a "legacy" decoder (e.g., a standard narrowband decoder) or decoding procedure that decodes the received bitstream 438 regardless of any watermark information that may be included in the received bitstream 438. The decoding block/module 450 may produce a decoded second signal 458. Thus, for example, if no watermark information is included in the received bitstream 438, the decoding block/module 450 may still recover a version of the second signal 408, which is the decoded second signal 458.

In some configurations, the operations performed by the high band modeling block/module 442 may depend on operations performed by the decoding block/module 450. For example, a model (e.g., EVRC-WB) used for a higher frequency band may depend on a decoded narrowband signal (e.g., the decoded second signal 458 decoded using AMR-NB). In this case, the decoded second signal 458 may be provided to the high band modeling block/module 442.

In some configurations, a decoded second signal 458 may be combined with a decoded first signal 454 by a synthesis filter bank 446 to produce a combined signal 456. For example, the decoded first signal 454 may include higher frequency audio information, while the decoded second signal 458 may include lower frequency audio information. It should be noted that the decoded first signal 454 may be a decoded version of the first signal 406 encoded by wireless communication device A 402. Additionally or alternatively, the decoded second signal 458 may be a decoded version of the second signal 408 encoded by wireless communication device A 402. The synthesis filter bank 446 may combine the decoded first signal 454 and the decoded second signal 458 to produce the combined signal 456, which may be a wide-band audio signal.

The combined signal 456 may be provided to a speaker 488. The speaker 488 may be a transducer that converts electrical or electronic signals into acoustic signals. For instance, the speaker 488 may convert an electronic wide-band audio signal (e.g., the combined signal 456) into an acoustic wide-band audio signal.

In some configurations, the mode selection block/module 466 may provide the mode indicator 448 to the synthesis filter bank 446. For example, in a configuration where the decoded first signal 454 and the decoded second signal 458 may be combined, the mode indicator 448 may cause the synthesis filter bank 446 to combine the decoded first signal 454 and the decoded second signal 458 according to a watermark or enhanced decoding mode. However, if watermark data or information is not detected in the received bitstream, the mode indicator 448 may cause the synthesis filter bank 446 to not combine signals. In that case, the decoder circuitry 450 may provide the decoded second signal 458 according to a conventional or legacy decoding mode.

If no watermark information is embedded in the received bitstream 438, the decoding block/module 450 may decode the received bitstream 438 (in a legacy mode, for example) to produce the decoded second signal 458. In this case, the synthesis filter bank 446 may be bypassed to provide the decoded second signal 458, without the additional information provided by the first signal 406. This may occur, for example, if the watermark information (from the first signal 406, for example) is destroyed in a transcoding operation in the network 428.

It should be noted that one or more of the elements (e.g., speaker 488, audio decoder 440, channel decoder 486, demodulator 482, receiver 478, etc.) included in wireless communication device B 434 may be implemented in hardware, software or a combination of both. For instance, one or more of the elements included in wireless communication device B 434 may be implemented as one or more integrated circuits, application specific integrated circuits (ASICs), etc., and/or using a processor and instructions.

Figure 5:
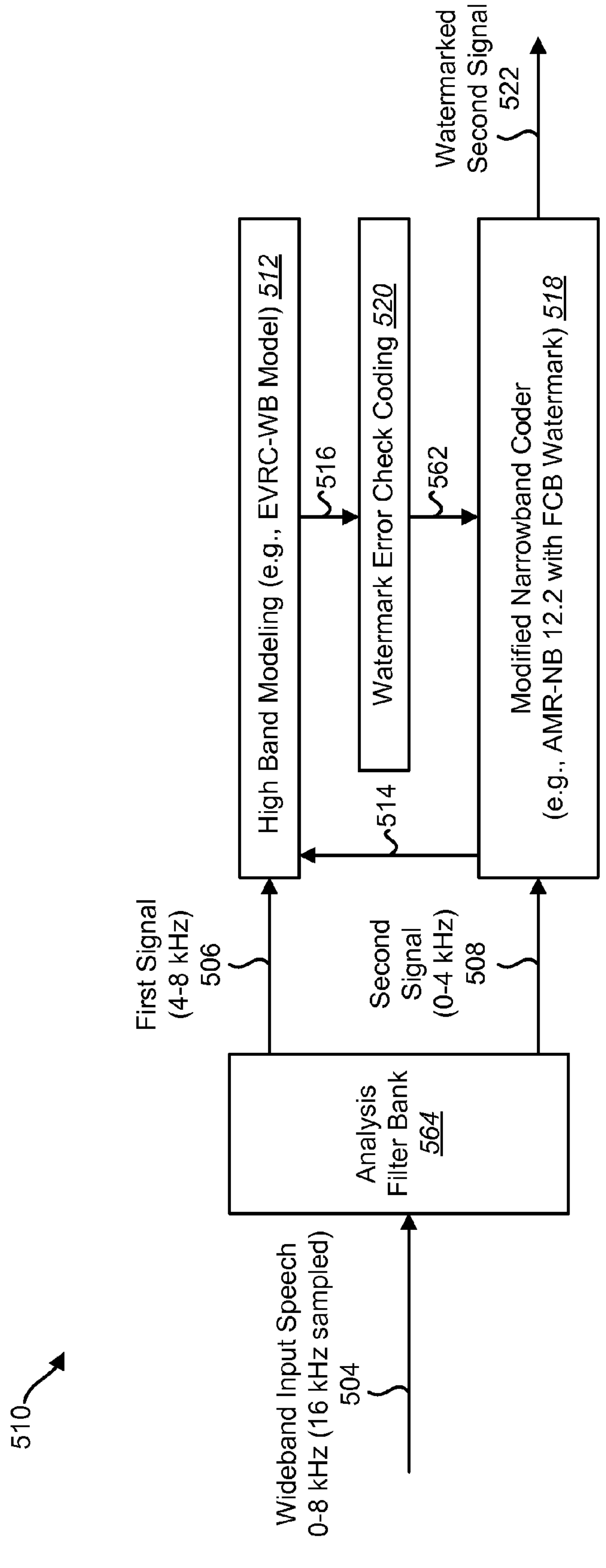
FIG. 5 is a block diagram illustrating one example of a watermarking encoder in accordance with the systems and methods disclosed herein.

FIG. 5 is a block diagram illustrating one example of a watermarking encoder 510 in accordance with the systems and methods disclosed herein. In this example, the encoder 510 may obtain a wideband (WB) speech signal 504, ranging from 0 to 8 kilohertz (kHz). The wideband speech signal 504 may be provided to an analysis filter bank 564 that divides the signal 504 into a first signal 506 or higher frequency component (e.g., 4-8 kHz) and a second signal 508 or lower frequency component (e.g., 0-4 kHz).

The second signal 508 or lower frequency component (e.g., 0-4 kHz) may be provided to a modified narrowband coder 518. In one example, the modified narrowband coder 518 may code the second signal 508 using AMR-NB 12.2 with a FCB watermark. The modified narrowband coder 518 may provide data 514 (e.g., a coded excitation) to the high band modeling block/module 512 in one configuration.

The first signal 506 or higher frequency component may be provided to the high band modeling block/module 512 (that uses an EVRC-WB model, for example). The high band modeling block/module 512 may encode or model the first signal 506 (e.g., higher frequency component). In some configurations, the high band modeling block/module 512 may encode or model the first signal 506 based on the data 514 (e.g., a coded excitation) provided by the modified narrowband coder 518. The encoding or modeling performed by the high band modeling block/module 512 may produce watermark data 516 (e.g., high band bits) that are provided to a watermark error check coding block/module 520.

The watermark error check coding block/module 520 may add error check coding to the watermark data 516 to produce watermark data with error check coding 562 that may be embedded into the second signal 508 (e.g., "carrier" signal). For example, the modified narrowband coder 518 may produce a coded bitstream that watermark bits (e.g., watermark data with error check coding 562) may be embedded into. In one configuration, the watermark error check coding block/module 520 may add a certain number of CRC bits per frame of watermark data. The coded second signal 508 with the embedded watermark information may be referred to as a watermarked second signal 522.

The modified narrowband coder 518 may embed the watermark data with error check coding 562 (e.g., high band bits) as a watermark in the second signal 508. It should be noted that the watermarked second signal 522 (e.g., bitstream) may be decodable by a standard (e.g., conventional) decoder, such as standard AMR. However, if a decoder does not include watermark decoding functionality, it may only be able to decode a version of the second signal 508 (e.g., a lower frequency component).

Figure 6:
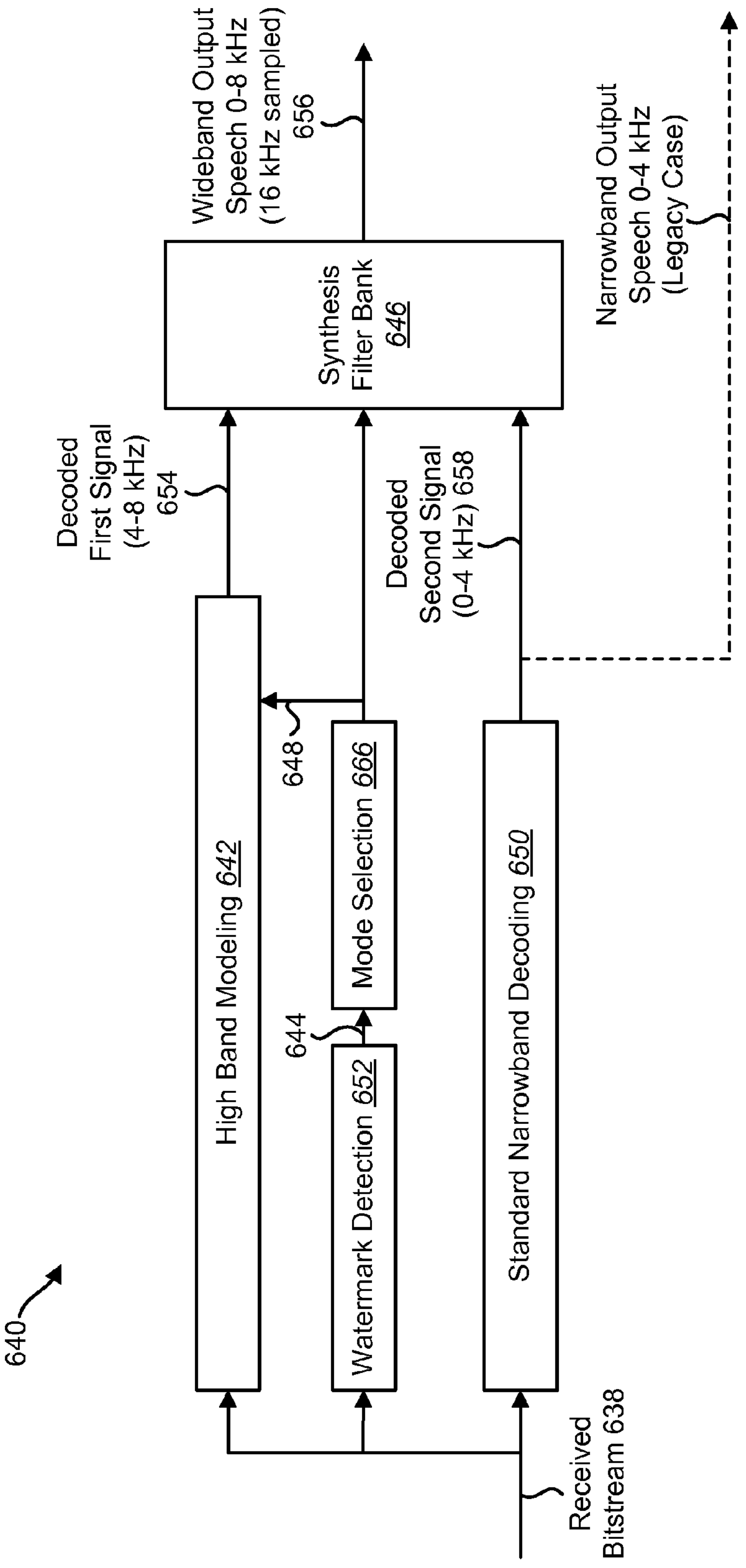
FIG. 6 is a block diagram illustrating one example of a decoder in accordance with the systems and methods disclosed herein.

FIG. 6 is a block diagram illustrating one example of a decoder 640 in accordance with the systems and methods disclosed herein. The decoder 640 may obtain a received bitstream 638 (e.g., a watermarked second signal). The received bitstream 638 may be decoded by the standard narrowband decoding block/module 650 to obtain a decoded second signal 658 (e.g., a lower frequency component signal ranging from 0-4 kHz). The decoded lower frequency component signal 658 may be provided to a high band modeling block/module 642 (e.g., modeler/decoder) in some configurations.

The received bitstream 638 may be provided to a watermark detection block/module 652. The watermark detection block/module 652 may be used to determine whether or not watermark information (e.g., watermark data with error check coding) is embedded in the received bitstream 638. In some configurations, the watermark detection block/module 652 may use an error check code (e.g., 4-bit CRC in multiple frames) to determine whether watermark information is embedded in the received bitstream 638. For example, the watermark detection block/module 652 may use an averaging scheme where if a certain number of CRC codes (e.g., 7) are correctly received within multiple frames (e.g., a number of consecutive frames such as 12), then the watermark detection block/module 652 may determine that watermark information is embedded on the received bitstream 638.

The watermark detection block/module 652 may produce a watermark indicator 644 based on its 652 determination of whether or not the received bitstream 638 includes watermark information (e.g., watermark data with error check coding 662). For example, if the watermark detection block/module 652 determines that watermark information is embedded in the received bitstream 638, then the watermark indicator 644 may so indicate. The watermark indicator 644 may be provided to the mode selection block/module 666.

The mode selection block/module 666 may be used to switch the decoder 640 between decoding modes. For example, the mode selection block/module 666 may switch between a conventional decoding mode (e.g., legacy decoding mode) and a watermark decoding mode (e.g., enhanced decoding mode). While in the conventional decoding mode, the decoder 640 may only produce a decoded second signal 658 (e.g., a recovered version of a second signal). Furthermore, in the conventional decoding mode, the decoder 640 may not attempt to extract any watermark information from the received bitstream 638. While in the watermark decoding mode, however, the decoder 640 may produce a decoded first signal 654. For example, the decoder 640 may extract, model and/or decode watermark information embedded in the received bitstream 638 while in the watermark decoding mode.

The mode selection block/module 666 may provide a mode indicator 648 to the high band modeling block/module 642. For instance, if the watermark detection block/module 652 indicates that watermark information is embedded in the received bitstream 638, the mode indicator 648 provided by the mode selection block/module 666 may cause the high band modeling block/module 642 to model and/or decode the watermark information (e.g., watermarked bits) embedded in the received bitstream 638. In some cases, the mode indicator 648 may indicate that there is no watermark information in the received bitstream 638. This may cause the high band modeling block/module 642 to not model and/or decode.

The high band modeling block/module 642 may extract and/or model watermark information embedded in the received bitstream 638 to obtain a decoded first signal 654 (e.g., a higher frequency component signal ranging from 4-8 kHz). The decoded first signal 654 and the decoded second signal 658 may be combined by a synthesis filter bank 646 to obtain a wideband (e.g., 0-8 kHz, 16 kHz sampled) output speech signal 656. However, in a "legacy" case or a case that the received bitstream 638 does not contain the watermark data (e.g., conventional decoding mode), the decoder 640 may produce a narrowband (e.g., 0-4 kHz) speech output signal (e.g., the decoded second signal 658).

In some configurations, the mode selection block/module 666 may provide the mode indicator 648 to the synthesis filter bank 646. For example, in a configuration where the decoded first signal 654 and the decoded second signal 658 may be combined, the mode indicator 648 may cause the synthesis filter bank 646 to combine the decoded first signal 654 and the decoded second signal 658 according to a watermark or enhanced decoding mode. However, if watermark data or information is not detected in the received bitstream, the mode indicator 648 may cause the synthesis filter bank 646 to not combine signals. In that case, the standard narrowband decoder 650 may provide the decoded second signal 658 according to a conventional or legacy decoding mode.

Figure 7:
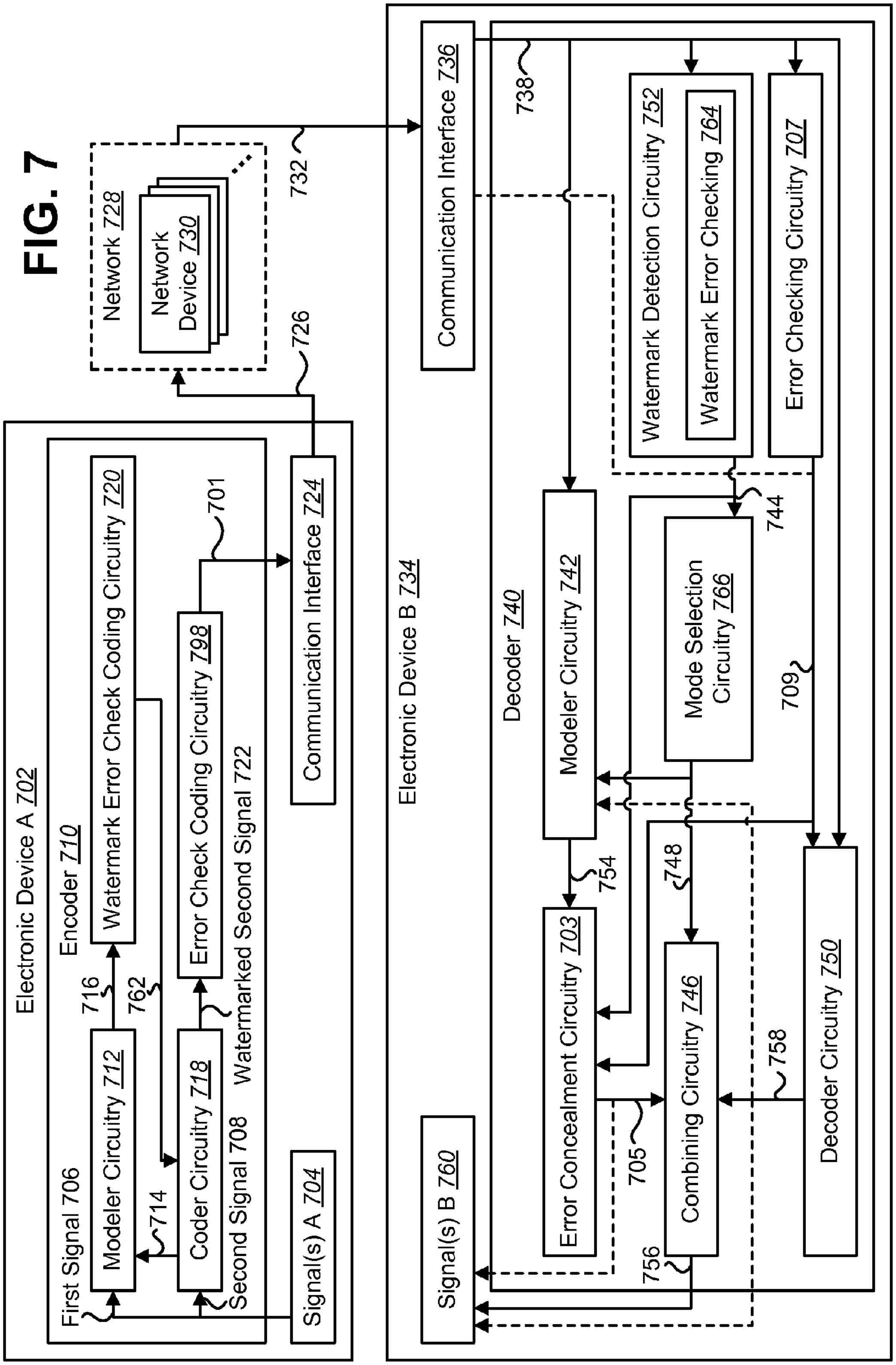
FIG. 7 is a block diagram illustrating a more specific configuration of electronic devices in which systems and methods for encoding and detecting a watermarked signal may be implemented.

FIG. 7 is a block diagram illustrating a more specific configuration of electronic devices 702, 734 in which systems and methods for encoding and detecting a watermarked signal may be implemented. Examples of electronic device A 702 and electronic device B 734 may include wireless communication devices (e.g., cellular phones, smart phones, personal digital assistants (PDAs), laptop computers, e-readers, etc.) and other devices.

Electronic device A 702 may include an encoder block/module 710 and/or a communication interface 724. The encoder block/module 710 may be used to encode and watermark a signal. The communication interface 724 may transmit one or more signals to another device (e.g., electronic device B 734).

Electronic device A 702 may obtain one or more signals A 704, such as audio or speech signals. For example, electronic device A 702 may capture signal A 704 using a microphone or may receive signal A 704 from another device (e.g., a Bluetooth headset). In some configurations, signal A 704 may be divided into different component signals (e.g., a higher frequency component signal and a lower frequency component signal, a monophonic signal and a stereo signal, etc.). In other configurations, unrelated signals A 704 may be obtained. Signal(s) A 704 may be provided to modeler circuitry 712 and coder circuitry 718 in an encoder 710. For example, a first signal 706 (e.g., signal component) may be provided to the modeler circuitry 712, while a second signal 708 (e.g., another signal component) is provided to the coder circuitry 718.

It should be noted that one or more of the elements included in electronic device A 702 may be implemented in hardware, software or a combination of both. For instance, the term "circuitry" as used herein may indicate that an element may be implemented using one or more circuit components (e.g., transistors, resistors, registers, inductors, capacitors, etc.), including processing blocks and/or memory cells. Thus, one or more of the elements included in electronic device A 702 may be implemented as one or more integrated circuits, application specific integrated circuits (ASICs), etc., and/or using a processor and instructions. It should also be noted that the term "block/module" may be used to indicate that an element may be implemented in hardware, software or a combination of both.

The coder circuitry 718 may perform coding on the second signal 708. For example, the coder circuitry 718 may perform adaptive multi-rate (AMR) coding on the second signal 708. For instance, the coder circuitry 718 may produce a coded bitstream that watermark data with error check coding 762 may be embedded into.

The modeler circuitry 712 may determine watermark data 716 (e.g., parameters, bits, etc.) based on the first signal 706 that may be embedded into the second signal 708 (e.g., "carrier" signal). For example, the modeler circuitry 712 may separately encode the first signal 706 into watermark data 716 that can be embedded into the coded bitstream. In yet another example, the modeler circuitry 712 may provide bits from the first signal 706 (without modification) as watermark data 716. In another example, the modeler circuitry 712 may provide parameters (e.g., high band bits) as watermark data 716.

The watermark data 716 may be provided to watermark error check coding circuitry 720. The watermark error check coding circuitry 720 may add an error check code to the watermark data 716 to produce watermark data with error check coding 762. One example of an error check code that may be used in accordance with the systems and methods disclosed herein is a cyclic redundancy check (CRC) code. The error check coding added to the watermark data 716 may allow a decoder to detect the presence of an embedded watermark (over multiple frames, for example). In some configurations, the error check coding added to the watermark data 716 by the watermark error check coding circuitry 720 may be specific to (e.g., only applicable to) the watermark data 716. The watermark data with error check coding 762 may be provided to the coder circuitry 718. As described above, the coder circuitry 718 may embed the watermark data with error check coding 762 into the second signal 708 to produce a watermarked second signal 722. In other words, the coded second signal 708 with the embedded watermark signal may be referred to as a watermarked second signal 722.

The coder circuitry 718 may code (e.g., encode) the second signal 708. In some configurations, this coding may produce data 714, which may be provided to the modeler circuitry 712. In one configuration, the modeler circuitry 712 may use an enhanced variable rate codec-wideband (EVRC-WB) model to model higher frequency components (from the first signal 706) that relies on lower frequency components (from the second signal 708) that may be encoded by the coder circuitry 718. Thus, the data 714 may be provided to the modeler circuitry 712 for use in modeling the higher frequency components. The resulting higher frequency component watermark data 716 (with error check coding 762) may then be embedded into the second signal 708 by the coder circuitry 718, thereby producing the watermarked second signal 722.

It should be noted that the watermarking process may alter some of the bits of an encoded second signal 708. For example, the second signal 708 may be referred to as a "carrier" signal or bitstream. In the watermarking process, some of the bits that make up the encoded second signal 708 may be altered in order to embed or insert the watermark data 716 (with error check coding 762) derived from the first signal 706 into the second signal 708 to produce the watermarked second signal 722. In some cases, this may be a source of degradation in the encoded second signal 708. However, this approach may be advantageous since decoders that are not designed to extract the watermark information may still recover a version of the second signal 708, without the extra information provided by the first signal 706. Thus, "legacy" devices and infrastructure may still function regardless of the watermarking. This approach further allows other decoders (that are designed to extract the watermark information) to be used to extract the additional watermark information provided by the first signal 706.

The watermarked second signal 722 may optionally be provided to error check coding circuitry 798. The error check coding circuitry 798 may add error check coding to the watermarked second signal 722 to produce a watermarked second signal with error check coding 701. For example, the error check coding circuitry 798 may add cyclic redundancy check (CRC) coding and/or forward error correction (FEC) coding to the watermarked second signal 722. The error check coding added by the error check coding circuitry 798 may be in addition to or alternatively from error check coding and/or FEC optionally provided by the communication interface 724. In other words, neither, both or one of the error check coding circuitry 798 and the communication interface 724 may add error check coding and/or FEC to the watermarked second signal 722, depending on the configuration. It should be noted that the error check coding that is added to the watermarked second signal 722 by the error check coding circuitry 798 and/or the communication interface 724 may not be specific to (e.g., only applicable to) the watermark data 716, but may be applicable to the watermarked second signal 722 (e.g., to the encoded second signal 708 and/or to the watermark data 716).

The watermarked second signal 722 or watermarked second signal with error check coding 701 may be provided to the communication interface 724. Examples of the communication interface 724 may include transceivers, network cards, wireless modems, etc. The communication interface 724 may be used to communicate (e.g., transmit) the watermarked second signal 722, 701 to another device, such as electronic device B 734 over a network 728. For example, the communication interface 724 may be based on wired and/or wireless technology. Some operations performed by the communication interface 724 may include modulation, formatting (e.g., packetizing, interleaving, scrambling, etc.), channel coding, upconversion, amplification, etc. Thus, electronic device A 702 may transmit a signal 726 that comprises the watermarked second signal 722.

The signal 726 (including the watermarked second signal 722, 701) may be sent to one or more network devices 730. For example, a network 728 may include the one or more network devices 730 and/or transmission mediums for communicating signals between devices (e.g., between electronic device A 702 and electronic device B 734). In the configuration illustrated in FIG. 7, the network 728 includes one or more network devices 730. Examples of network devices 730 include base stations, routers, servers, bridges, gateways, etc.

In some cases, one or more network devices 730 may transcode the signal 726 (that includes the watermarked second signal 722). Transcoding may include decoding the transmitted signal 726 and re-encoding it (into another format, for example). In some cases, transcoding the signal 726 may destroy the watermark information embedded in the signal 726. In such a case, electronic device B 734 may receive a signal that no longer contains the watermark information.

Other network devices 730 may not use any transcoding. For instance, if a network 728 uses devices that do not transcode signals, the network 728 may provide tandem-free/transcoder-free operation (TFO/TrFO). In this case, the watermark information embedded in the watermarked second signal 722 may be preserved as it is sent to another device (e.g., electronic device B 734).

Electronic device B 734 may receive a signal 732 (via the network 728), such as a signal 732 having watermark information preserved or a signal 732 without watermark information. For instance, electronic device B 734 may receive a signal 732 using a communication interface 736. Examples of the communication interface 736 may include transceivers, network cards, wireless modems, etc. The communication interface 736 may perform operations such as downconversion, synchronization, deformatting (e.g., depacketizing, unscrambling, de-interleaving, etc.) and/or channel decoding on the signal 732 to extract a received bitstream 738. The received bitstream 738 (which may or may not be a watermarked bitstream) may be provided to a decoder block/module 740. For example, the received bitstream 738 may be provided to modeler circuitry 742, to watermark detection circuitry 752 and/or to decoder circuitry 750. In some configurations, the received bitstream 738 may be provided to error checking circuitry 707.

The decoder block/module 740 may include modeler circuitry 742, error concealment circuitry 703, watermark detection circuitry 752, mode selection circuitry 766, error checking circuitry 707, combining circuitry 746 and/or decoder circuitry 750. The watermark detection circuitry 752 may be used to determine whether or not watermark information (e.g., watermark data with error check coding 762) is embedded in the received bitstream 738. In one configuration, the watermark detection circuitry 752 may include a watermark error checking block/module 764. The watermark error checking block/module 764 may use an error check code (e.g., 4-bit CRC in multiple frames) to determine whether watermark information is embedded in the received bitstream 738. In one configuration, the watermark detection circuitry 752 may use an averaging scheme where if a certain number of CRC codes (e.g., 7) are correctly received within multiple frames (e.g., a number of consecutive frames such as 12), then the watermark detection circuitry 752 may determine that watermark information is embedded on the received bitstream 738. This approach may reduce the risk of false positive indicators, where watermark decoding would be performed when no watermark information was actually embedded in the received signal. In some configurations, the watermark error checking block/module 764 may additionally or alternatively be used to determine whether a watermarked frame was received in error (in order to conceal the error, for example).

The watermark detection circuitry 752 may produce a watermark indicator 744 based on its 752 determination of whether or not the received bitstream 738 includes watermark information (e.g., watermark data with error check coding 762). For example, if the watermark detection circuitry 752 determines that watermark information is embedded in the received bitstream 738, then the watermark indicator 744 may so indicate. The watermark indicator 744 may be provided to the mode selection circuitry 766 and/or to the error concealment circuitry 703.

The mode selection circuitry 766 may be used to switch the decoder block/module 740 between decoding modes. For example, the mode selection circuitry 766 may switch between a conventional decoding mode (e.g., legacy decoding mode) and a watermark decoding mode (e.g., enhanced decoding mode). While in the conventional decoding mode, the decoder block/module 740 may only produce a decoded second signal 758 (e.g., a recovered version of the second signal 708). Furthermore, in the conventional decoding mode, the decoder block/module 740 may not attempt to extract any watermark information from the received bitstream 738. While in the watermark decoding mode, however, the decoder block/module 740 may produce a decoded first signal 754. For example, the decoder block/module 740 may extract, model and/or decode watermark information embedded in the received bitstream 738 while in the watermark decoding mode.

The mode selection circuitry 766 may provide a mode indicator 748 to the modeler circuitry 742. For instance, if the watermark detection circuitry 752 indicates that watermark information is embedded in the received bitstream 738, the mode indicator 748 provided by the mode selection circuitry 766 may cause the modeler circuitry 742 to model and/or decode the watermark information (e.g., watermarked bits) embedded in the received bitstream 738. In some cases, the mode indicator 748 may indicate that there is no watermark information in the received bitstream 738. This may cause the modeler circuitry 742 to not model and/or decode.

The modeler circuitry 742 may extract, model and/or decode watermark information or data from the received bitstream 738. For example, the modeling/decoding block/module may extract, model and/or decode watermark data from the received bitstream 738 to produce a decoded first signal 754.

The decoder circuitry 750 may decode the received bitstream 738. In some configurations, the decoder circuitry 750 may use a "legacy" decoder (e.g., a standard narrowband decoder) or decoding procedure that decodes the received bitstream 738 regardless of any watermark information that may or may not be included in the received bitstream 738. The decoder circuitry 750 may produce a decoded second signal 758. Thus, for example, if no watermark information is included in the received bitstream 738, the decoder circuitry 750 may still recover a version of the second signal 708, which is the decoded second signal 758.

In some configurations, the operations performed by the modeler circuitry 742 may depend on operations performed by the decoder circuitry 750. For example, a model (e.g., EVRC-WB) used for a higher frequency band may depend on a decoded narrowband signal (e.g., the decoded second signal 758 decoded using AMR-NB). In this case, the decoded second signal 758 may be provided to the modeler circuitry 742.

As described above, the watermark detection circuitry 752 may provide a watermark indicator 744 (e.g., error indication) to the error concealment circuitry 703. If the watermark indicator 744 (e.g., error indication) indicates that watermark information is received erroneously, the error concealment circuitry 703 may conceal the error. In one configuration, this may be done by extrapolating recently received watermark information that was correctly modeled and/or decoded. In some configurations, the error checking circuitry 707 may additionally or alternatively provide an error indication 709 to the error concealment circuitry 703. This error indication 709 is separate from the watermark indicator 744 (e.g., error indication) provided by the watermark detection circuitry 752. The error concealment circuitry 703 may thus conceal errors in the decoded first signal 754 based on watermark error checking and/or other error checking (that is not specific to the watermark information, for example). In some configurations, the error concealment output 705 may be provided to the combining circuitry 746. The error concealment output 705 may be the same as the decoded first signal 754 when no error concealment is performed. For instance, the error concealment circuitry 703 may be bypassed by the decoded first signal 754 or the decoded first signal 754 may be passed through the error concealment circuitry 703 without modification when error concealment is not performed. However, when error concealment is performed, the error concealment circuitry 703 may modify and/or replace the decoded first signal 754 with an error concealment output 705 that attempts to conceal the incorrectly decoded first signal 754.

For example, in addition to the general status of the received bitstream 738 as described above, channel errors may cause spurious/transient errors in the watermark information. The errors may be detected in one or more ways. For example, a cyclic redundancy check (CRC) for the watermark information (as indicated by the watermark error checking block/module 764, for example) may be decoded incorrectly. Additionally or alternatively, the decoder block/module 740 may detect a frame loss (e.g., Bad Frame Indication (BFI) for an adaptive multi-rate (AMR) codec) and/or other error using the error checking circuitry 707. In such cases, it may be beneficial to maintain a wideband output, for example. This may be done rather than risk fast bandwidth switching that can cause artifacts. In these instances, for example, error concealment techniques may be used on the decoded first signal 754 to gracefully extrapolate and attenuate the decoded first signal 754 (e.g., high band). In this way, if the loss of the watermark information is brief, a user may not even perceive the loss of the decoded first signal 754 (e.g., high band) for this brief period of time.

The error checking circuitry 707 may check the received bitstream 738 for errors and provide an error indication 709 to the decoder circuitry 750 and/or to the error concealment circuitry 703. Additionally or alternatively, the communication interface 736 may check the received signal 732 for errors and/or provide an error indication 709 to the decoder circuitry 750 and/or to the error concealment circuitry 703. As described above, the error concealment circuitry 703 may use the error indication 709 from the error checking circuitry 707 and/or from the communication interface 736 to conceal errors in the decoded first signal 754. Additionally or alternatively, the decoder circuitry 750 may use the error indication 709 from the error checking circuitry 707 and/or from the communication interface 736 to perform one or more operations (e.g., error concealment) on the decoded second signal 758.

In some configurations, a decoded second signal 758 may be combined with a decoded first signal 754 (e.g., error concealment output 705) by combining circuitry 746 to produce a combined signal 756. In other configurations, the watermark data from the received bitstream 738 and the received bitstream 738 may be decoded separately to produce the decoded first signal 754 (e.g., error concealment output 705) and the decoded second signal 758. Thus, one or more signals B 760 may include a decoded first signal 754, a separate decoded second signal 758 and/or may include a combined signal 756. It should be noted that the decoded first signal 754 may be a decoded version of the first signal 706 encoded by electronic device A 702. Additionally or alternatively, the decoded second signal 758 may be a decoded version of the second signal 708 encoded by electronic device A 702.

In some configurations, the mode selection circuitry 766 may provide the mode indicator 748 to the combining circuitry 746. For example, in a configuration where the decoded first signal 754 and the decoded second signal 758 may be combined, the mode indicator 748 may cause the combining circuitry 746 to combine the decoded first signal 754 and the decoded second signal 758 according to a watermark or enhanced decoding mode. However, if watermark data or information is not detected in the received bitstream, the mode indicator 748 may cause the combining circuitry 746 to not combine signals. In that case, the decoder circuitry 750 may provide the decoded second signal 758 according to a conventional or legacy decoding mode.

If no watermark information is embedded in the received bitstream 738, the decoder circuitry 750 may decode the received bitstream 738 (in a legacy mode, for example) to produce the decoded second signal 758. This may provide a decoded second signal 758, without the additional information provided by the first signal 706. This may occur, for example, if the watermark information (from the first signal 706, for example) is destroyed in a transcoding operation in the network 728.

In some configurations, electronic device B 734 may be incapable of decoding the watermark data embedded in the received bitstream 738. For example, electronic device B 734 may not include modeler circuitry 742 for extracting the embedded watermark data in some configurations. In such a case, electronic device B 734 may simply decode the received bitstream 738 to produce the decoded second signal 758.

It should be noted that one or more of the elements included in electronic device B 734 may be implemented in hardware (e.g., circuitry), software or a combination of both. For instance, one or more of the elements included in electronic device B 734 may be implemented as one or more integrated circuits, application specific integrated circuits (ASICs), etc., and/or using a processor and instructions.

In some configurations, an electronic device (e.g., electronic device A 702, electronic device B 734, etc.) may include both an encoder and a decoder for encoding a watermarked signal and/or decoding an encoded watermarked signal. For instance, electronic device A 702 may include both the encoder 710 and a decoder similar to the decoder 740 included in electronic device B 734. In some configurations, both the encoder 710 and a decoder similar to the decoder 740 included in electronic device B 734 may be included in a codec. Thus, a single electronic device may be configured to both produce encoded watermarked signals and to decode encoded watermarked signals.

It should be noted that the watermarked second signal 722 may not necessarily be transmitted to another electronic device in some configurations and/or instances. For example, electronic device A 702 may instead store the watermarked second signal 722 for later access (e.g., decoding, playback, etc.).

Figure 8:
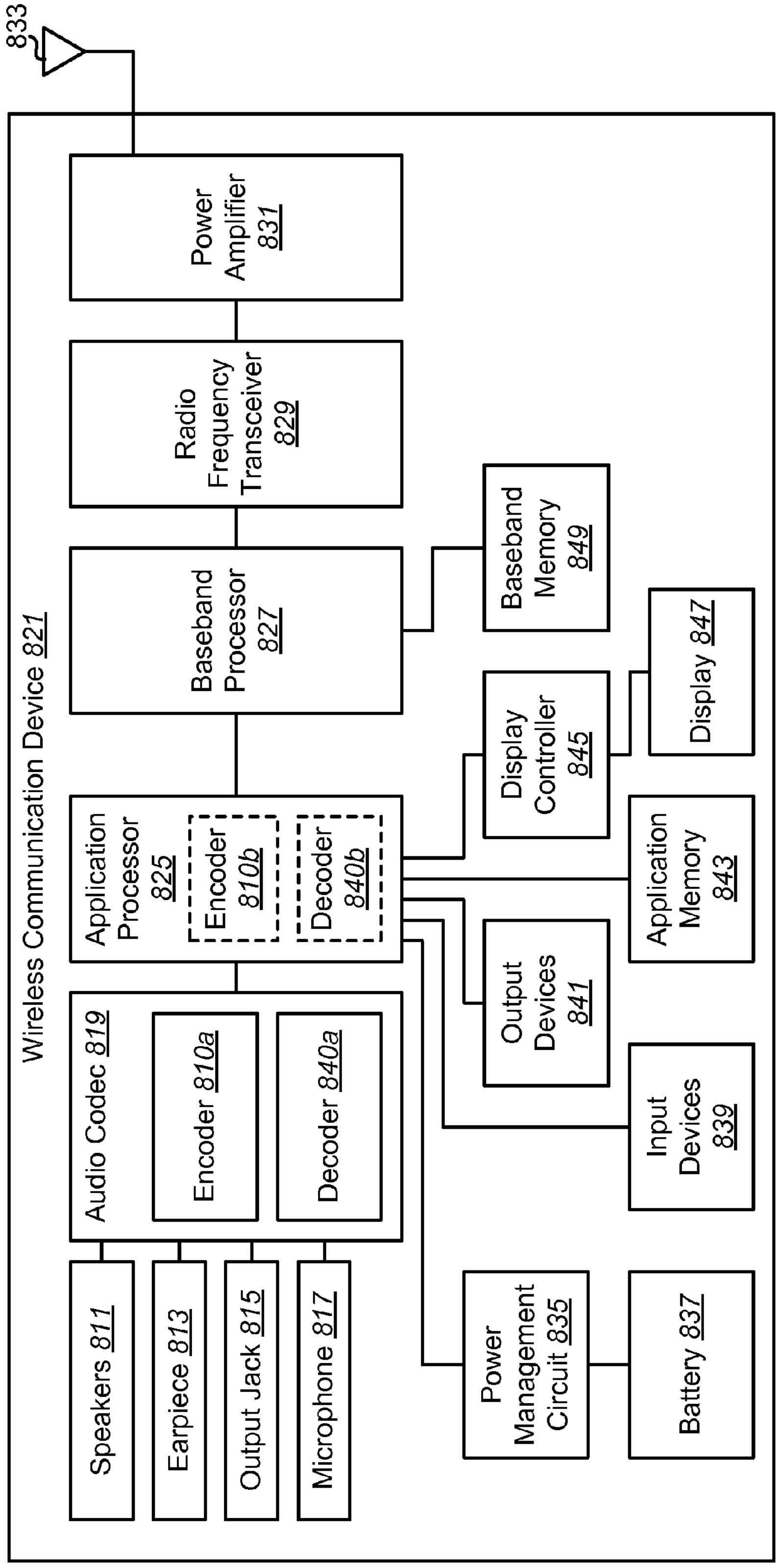
FIG. 8 is a block diagram illustrating one configuration of a wireless communication device in which systems and methods for encoding and detecting a watermarked signal may be implemented.

FIG. 8 is a block diagram illustrating one configuration of a wireless communication device 821 in which systems and methods for encoding and detecting a watermarked signal may be implemented. The wireless communication device 821 may be one example of one or more of the electronic devices 102, 134, 702, 734 and wireless communication devices 402, 434 described above. The wireless communication device 821 may include an application processor 825. The application processor 825 generally processes instructions (e.g., runs programs) to perform functions on the wireless communication device 821. The application processor 825 may be coupled to an audio coder/decoder (codec) 819.

The audio codec 819 may be an electronic device (e.g., integrated circuit) used for coding and/or decoding audio signals. The audio codec 819 may be coupled to one or more speakers 811, an earpiece 813, an output jack 815 and/or one or more microphones 817. The speakers 811 may include one or more electro-acoustic transducers that convert electrical or electronic signals into acoustic signals. For example, the speakers 811 may be used to play music or output a speakerphone conversation, etc. The earpiece 813 may be another speaker or electro-acoustic transducer that can be used to output acoustic signals (e.g., speech signals) to a user. For example, the earpiece 813 may be used such that only a user may reliably hear the acoustic signal. The output jack 815 may be used for coupling other devices to the wireless communication device 821 for outputting audio, such as headphones. The speakers 811, earpiece 813 and/or output jack 815 may generally be used for outputting an audio signal from the audio codec 819. The one or more microphones 817 may be one or more acousto-electric transducers that convert an acoustic signal (such as a user's voice) into electrical or electronic signals that are provided to the audio codec 819.

The audio codec 819 may include an encoder 810*a*. The encoders 110, 410, 510, 710 described above may be examples of the encoder 810*a* (and/or encoder 810*b*). In an alternative configuration, an encoder 810*b* may be included in the application processor 825. One or more of the encoders 810*a-b* (e.g., the audio codec 819) may be used to perform the method 300 described above in connection with FIG. 3 for encoding a watermarked signal.

The audio codec 819 may additionally or alternatively include a decoder 840*a*. The decoders 140, 440, 640, 740 described above may be examples of the decoder 840*a* (and/or decoder 840*b*). In an alternative configuration, a decoder 840*b* may be included in the application processor 825. One or more of the decoders 840*a-b* (e.g., the audio codec 819) may perform the method 200 described above in connection with FIG. 2 for decoding a signal.

The application processor 825 may also be coupled to a power management circuit 835. One example of the power management circuit 835 is a power management integrated circuit (PMIC), which may be used to manage the electrical power consumption of the wireless communication device 821. The power management circuit 835 may be coupled to a battery 837. The battery 837 may generally provide electrical power to the wireless communication device 821.

The application processor 825 may be coupled to one or more input devices 839 for receiving input. Examples of input devices 839 include infrared sensors, image sensors, accelerometers, touch sensors, keypads, etc. The input devices 839 may allow user interaction with the wireless communication device 821. The application processor 825 may also be coupled to one or more output devices 841. Examples of output devices 841 include printers, projectors, screens, haptic devices, etc. The output devices 841 may allow the wireless communication device 821 to produce output that may be experienced by a user.

The application processor 825 may be coupled to application memory 843. The application memory 843 may be any electronic device that is capable of storing electronic information. Examples of application memory 843 include double data rate synchronous dynamic random access memory (DDRAM), synchronous dynamic random access memory (SDRAM), flash memory, etc. The application memory 843 may provide storage for the application processor 825. For instance, the application memory 843 may store data and/or instructions for the functioning of programs that are run on the application processor 825.

The application processor 825 may be coupled to a display controller 845, which in turn may be coupled to a display 847. The display controller 845 may be a hardware block that is used to generate images on the display 847. For example, the display controller 845 may translate instructions and/or data from the application processor 825 into images that can be presented on the display 847. Examples of the display 847 include liquid crystal display (LCD) panels, light emitting diode (LED) panels, cathode ray tube (CRT) displays, plasma displays, etc.

The application processor 825 may be coupled to a baseband processor 827. The baseband processor 827 generally processes communication signals. For example, the baseband processor 827 may demodulate and/or decode (e.g., channel decode) received signals. Additionally or alternatively, the baseband processor 827 may encode (e.g., channel encode) and/or modulate signals in preparation for transmission.

The baseband processor 827 may be coupled to baseband memory 849. The baseband memory 849 may be any electronic device capable of storing electronic information, such as SDRAM, DDRAM, flash memory, etc. The baseband processor 827 may read information (e.g., instructions and/or data) from and/or write information to the baseband memory 849. Additionally or alternatively, the baseband processor 827 may use instructions and/or data stored in the baseband memory 849 to perform communication operations.

The baseband processor 827 may be coupled to a radio frequency (RF) transceiver 829. The RF transceiver 829 may be coupled to a power amplifier 831 and one or more antennas 833. The RF transceiver 829 may transmit and/or receive radio frequency signals. For example, the RF transceiver 829 may transmit an RF signal using a power amplifier 831 and one or more antennas 833. The RF transceiver 829 may also receive RF signals using the one or more antennas 833.

Figure 9:
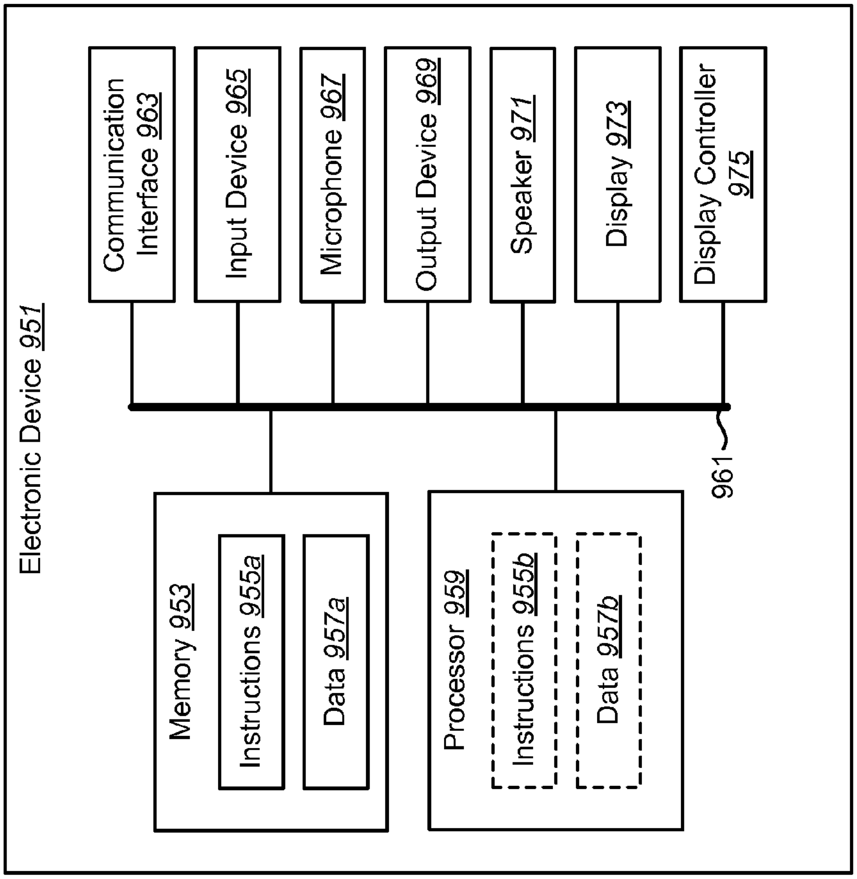
FIG. 9 illustrates various components that may be utilized in an electronic device.

FIG. 9 illustrates various components that may be utilized in an electronic device 951. The illustrated components may be located within the same physical structure or in separate housings or structures. One or more of the electronic devices 102, 134, 702, 734 described previously may be configured similarly to the electronic device 951. The electronic device 951 includes a processor 959. The processor 959 may be a general purpose single- or multi-chip microprocessor (e.g., an ARM), a special purpose microprocessor (e.g., a digital signal processor (DSP)), a microcontroller, a programmable gate array, etc. The processor 959 may be referred to as a central processing unit (CPU). Although just a single processor 959 is shown in the electronic device 951 of FIG. 9, in an alternative configuration, a combination of processors (e.g., an ARM and DSP) could be used.

The electronic device 951 also includes memory 953 in electronic communication with the processor 959. That is, the processor 959 can read information from and/or write information to the memory 953. The memory 953 may be any electronic component capable of storing electronic information. The memory 953 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers, and so forth, including combinations thereof.

Data 957*a* and instructions 955*a* may be stored in the memory 953. The instructions 955*a* may include one or more programs, routines, sub-routines, functions, procedures, etc. The instructions 955*a* may include a single computer-readable statement or many computer-readable statements. The instructions 955*a* may be executable by the processor 959 to implement one or more of the methods 200, 300 described above. Executing the instructions 955*a* may involve the use of the data 957*a* that is stored in the memory 953. FIG. 9 shows some instructions 955*b* and data 957*b* being loaded into the processor 959 (which may come from instructions 955*a* and data 957*a*).

The electronic device 951 may also include one or more communication interfaces 963 for communicating with other electronic devices. The communication interfaces 963 may be based on wired communication technology, wireless communication technology, or both. Examples of different types of communication interfaces 963 include a serial port, a parallel port, a Universal Serial Bus (USB), an Ethernet adapter, an IEEE 1394 bus interface, a small computer system interface (SCSI) bus interface, an infrared (IR) communication port, a Bluetooth wireless communication adapter, and so forth.

The electronic device 951 may also include one or more input devices 965 and one or more output devices 969. Examples of different kinds of input devices 965 include a keyboard, mouse, microphone, remote control device, button, joystick, trackball, touchpad, lightpen, etc. For instance, the electronic device 951 may include one or more microphones 967 for capturing acoustic signals. In one configuration, a microphone 967 may be a transducer that converts acoustic signals (e.g., voice, speech) into electrical or electronic signals. Examples of different kinds of output devices 969 include a speaker, printer, etc. For instance, the electronic device 951 may include one or more speakers 971. In one configuration, a speaker 971 may be a transducer that converts electrical or electronic signals into acoustic signals. One specific type of output device which may be typically included in an electronic device 951 is a display device 973. Display devices 973 used with configurations disclosed herein may utilize any suitable image projection technology, such as a cathode ray tube (CRT), liquid crystal display (LCD), light-emitting diode (LED), gas plasma, electroluminescence, or the like. A display controller 975 may also be provided for converting data stored in the memory 953 into text, graphics, and/or moving images (as appropriate) shown on the display device 973.

The various components of the electronic device 951 may be coupled together by one or more buses, which may include a power bus, a control signal bus, a status signal bus, a data bus, etc. For simplicity, the various buses are illustrated in FIG. 9 as a bus system 961. It should be noted that FIG. 9 illustrates only one possible configuration of an electronic device 951. Various other architectures and components may be utilized.

Figure 10:
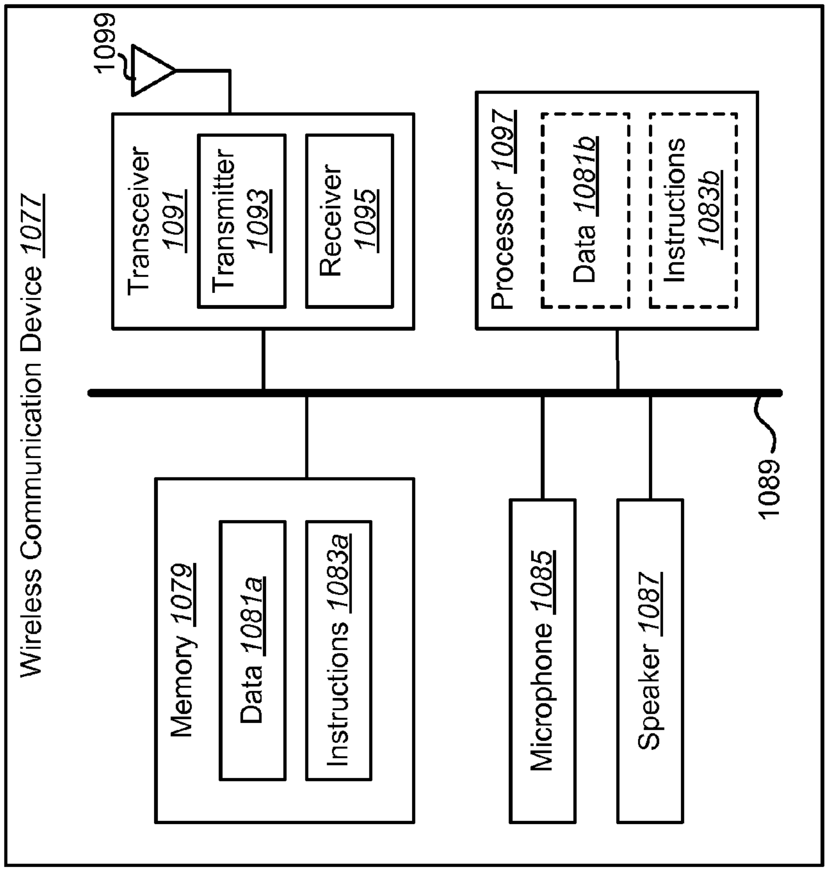
FIG. 10 illustrates certain components that may be included within a wireless communication device.

FIG. 10 illustrates certain components that may be included within a wireless communication device 1077. One or more of the electronic devices 102, 134, 702, 734, 951 and/or one or more of the wireless communication devices 402, 434, 821 described above may be configured similarly to the wireless communication device 1077 that is shown in FIG. 10.

The wireless communication device 1077 includes a processor 1097. The processor 1097 may be a general purpose single- or multi-chip microprocessor (e.g., an ARM), a special purpose microprocessor (e.g., a digital signal processor (DSP)), a microcontroller, a programmable gate array, etc. The processor 1097 may be referred to as a central processing unit (CPU). Although just a single processor 1097 is shown in the wireless communication device 1077 of FIG. 10, in an alternative configuration, a combination of processors (e.g., an ARM and DSP) could be used.

The wireless communication device 1077 also includes memory 1079 in electronic communication with the processor 1097 (i.e., the processor 1097 can read information from and/or write information to the memory 1079). The memory 1079 may be any electronic component capable of storing electronic information. The memory 1079 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers, and so forth, including combinations thereof.

Data 1081*a* and instructions 1083*a* may be stored in the memory 1079. The instructions 1083*a* may include one or more programs, routines, sub-routines, functions, procedures, code, etc. The instructions 1083*a* may include a single computer-readable statement or many computer-readable statements. The instructions 1083*a* may be executable by the processor 1097 to implement one or more of the methods 200, 300 described above. Executing the instructions 1083*a* may involve the use of the data 1081*a* that is stored in the memory 1079. FIG. 10 shows some instructions 1083*b* and data 1081*b* being loaded into the processor 1097 (which may come from instructions 1083*a* and data 1081*a*).

The wireless communication device 1077 may also include a transmitter 1093 and a receiver 1095 to allow transmission and reception of signals between the wireless communication device 1077 and a remote location (e.g., another electronic device, wireless communication device, etc.). The transmitter 1093 and receiver 1095 may be collectively referred to as a transceiver 1091. An antenna 1099 may be electrically coupled to the transceiver 1091. The wireless communication device 1077 may also include (not shown) multiple transmitters, multiple receivers, multiple transceivers and/or multiple antenna.

In some configurations, the wireless communication device 1077 may include one or more microphones 1085 for capturing acoustic signals. In one configuration, a microphone 1085 may be a transducer that converts acoustic signals (e.g., voice, speech) into electrical or electronic signals. Additionally or alternatively, the wireless communication device 1077 may include one or more speakers 1087. In one configuration, a speaker 1087 may be a transducer that converts electrical or electronic signals into acoustic signals.

The various components of the wireless communication device 1077 may be coupled together by one or more buses, which may include a power bus, a control signal bus, a status signal bus, a data bus, etc. For simplicity, the various buses are illustrated in FIG. 10 as a bus system 1089.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer or processor. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for decoding a signal on an electronic device, comprising:

receiving a signal that comprises a digital audio signal;

extracting a bitstream from the signal, wherein the bitstream comprises the digital audio signal;

performing watermark error checking using cyclic redundancy check (CRC) on the bitstream for multiple consecutive frames;

determining whether watermark data is detected based on the watermark error checking, based on an averaging scheme that comprises determining whether more than a number M of error check codes indicate correct data reception within a number N of said frames, wherein each of the error check codes corresponds to one of said frames, and wherein the watermark data is detected in all of the number N of said frames in a case that more than the number M of the error check codes indicate correct data reception;

selecting a first decoding mode in a case watermark data is detected or selecting a second decoding mode in a case watermark data is not detected, wherein the first decoding mode comprises modeling the watermark data to obtain a decoded first signal and decoding the bitstream to obtain a decoded second signal, and the second decoding mode comprises decoding the bitstream to obtain the decoded second signal without extracting watermark data;

performing decoding according to the first decoding mode in a case the first decoding mode is selected or the second decoding mode in a case the second decoding mode is selected; and outputting a decoded second signal that is a second digital audio signal in a case that the watermark data is not detected or outputting a decoded first signal that is a first digital audio signal in a case that the watermark data is detected.

2. The method of claim 1, wherein in the case that the watermark data is detected, the method further comprises:

determining whether an error is detected based on the watermark error checking; and combining the decoded first signal and the decoded second signal in a case that no error is detected.

3. The method of claim 2, wherein determining whether an error is detected is also based on performing error checking on the bitstream that is not specific to the watermark data.

4. The method of claim 2, wherein in a case that an error is detected, the method further comprises:

concealing the decoded first signal to obtain an error concealment output; and combining the error concealment output and the decoded second signal.

5. The method of claim 1, wherein the bitstream is a narrowband bitstream and the watermark data comprises a layer of wideband information within the narrowband bitstream.

6. The method of claim 1, wherein said frames are temporally distinct.

7. The method of claim 1, wherein determining whether the watermark data is detected is performed in real time.

8. A method for encoding a watermarked signal on an electronic device, comprising:

obtaining a first signal and a second signal, wherein the first signal and the second signal comprise digital audio signals;

modeling the first signal to obtain watermark data;

adding a cyclic redundancy check (CRC) error check code to multiple consecutive frames of the watermark data, wherein the watermark data is indicated based on an averaging scheme that indicates watermark data in a case that more than a number M of error check codes indicate correct data reception within a number N of said frames, wherein each of the error check codes corresponds to one of said frames, wherein the watermark data is indicated in all of the number N of said frames in a case that more than the number M of the error check codes indicate correct data reception, and wherein adding the CRC error check code indicates a mode to decode the first signal and the second signal, and comprises adding an amount of error check code to said frames that is equal to or smaller than a predetermined number of error check bits per predetermined number of information bits;

encoding the second signal by embedding the watermark data into the second signal to obtain a watermarked second signal; and outputting the watermarked second signal, wherein the watermarked second signal comprises a digital audio signal.

9. The method of claim 8, wherein a proportion equal to or smaller than four error check bits per twenty information bits is the amount of error check code added to each of the said frames.

10. An electronic device configured for decoding a signal, comprising:

receiver circuitry configured to receive a signal that comprises a digital audio signal;

watermark detection circuitry configured to perform watermark error checking using cyclic redundancy check (CRC) on a bitstream extracted from the signal for multiple consecutive frames and to determine whether watermark data is detected based on the watermark error checking, based on an averaging scheme that comprises determining whether more than a number M of error check codes indicate correct data reception within a number N of said frames, wherein each of the error check codes corresponds to one of said frames, wherein the watermark data is detected in all of the number N of said frames in a case that more than the number M of the error check codes indicate correct data reception, and wherein the bitstream comprises the digital audio signal;

mode selection circuitry configured to select a first decoding mode in a case watermark data is detected or to select a second decoding mode in a case watermark data is not detected, wherein the first decoding mode comprises modeling the watermark data to obtain a decoded first signal and decoding the bitstream to obtain a decoded second signal, and the second decoding mode comprises decoding the bitstream to obtain the decoded second signal without extracting watermark data;

decoder circuitry configured to perform decoding according to the first decoding mode in a case the first decoding mode is selected or the second decoding mode in a case the second decoding mode is selected, wherein the decoder circuitry is configured to output a decoded second signal that is a second digital audio signal in a case that the watermark data is not detected or to output a decoded first signal that is a first digital audio signal in a case that the watermark data is detected.

11. The electronic device of claim 10, wherein the watermark detection circuitry is configured to determine whether an error is detected based on the watermark error checking in the case that the watermark data is detected, and wherein the electronic device further comprises combining circuitry configured to combine the decoded first signal and the decoded second signal in a case that no error is detected.

12. The electronic device of claim 11, wherein determining whether an error is detected is also based on performing, by error checking circuitry, error checking on the bitstream that is not specific to the watermark data.

13. The electronic device of claim 11, further comprising error concealment circuitry configured to conceal the decoded first signal to obtain an error concealment output in a case that an error is detected, and wherein the combining circuitry combines the error concealment output and the decoded second signal in the case that an error is detected.

14. The electronic device of claim 10, wherein the bitstream is a narrowband bitstream and the watermark data comprises a layer of wideband information within the narrowband bitstream.

15. The electronic device of claim 10, wherein said frames are temporally distinct.

16. The electronic device of claim 10, wherein determining whether the watermark data is detected is performed in real time.

17. An electronic device for encoding a watermarked signal, comprising:

modeler circuitry configured to model a first signal to obtain watermark data, wherein the first signal comprises a digital audio signal;

watermark error check coding circuitry coupled to the modeler circuitry, wherein the watermark error check coding circuitry is configured to add a cyclic redundancy check (CRC) error check code to multiple consecutive frames of the watermark data, wherein the watermark data is indicated based on an averaging scheme that indicates watermark data in a case that more than a number M of error check codes indicate correct data reception within a number N of said frames, wherein each of the error check codes corresponds to one of said frames, wherein the watermark data is indicated in all of the number N of said frames in a case that more than the number M of the error check codes indicate correct data reception, and wherein adding the CRC error check code indicates a mode to decode the first signal and the second signal, and comprises adding an amount of error check code to said frames that is equal to or smaller than a predetermined number of error check bits per predetermined number of information bits; and coder circuitry coupled to the watermark error check coding circuitry, wherein the coder circuitry is configured to encode a second signal that comprises a digital audio signal by embedding the watermark data into the second signal to obtain a watermarked second signal, wherein the watermarked second signal comprises a digital audio signal.

18. The electronic device of claim 17, wherein a proportion equal to or smaller than four error check bits per twenty information bits is the amount of error check code added to each of the said frames.

19. A computer-program product for decoding a signal, comprising a non-transitory tangible computer-readable medium having instructions thereon, the instructions comprising:

code for causing an electronic device to receive a signal that comprises a digital audio signal;

code for causing the electronic device to extract a bitstream from the signal, wherein the bitstream comprises the digital audio signal;

code for causing the electronic device to perform watermark error checking using cyclic redundancy check (CRC) on the bitstream for multiple consecutive frames;

code for causing the electronic device to determine whether watermark data is detected based on the watermark error checking, based on an averaging scheme that comprises determining whether more than a number M of error check codes indicate correct data reception within a number N of said frames, wherein each of the error check codes corresponds to one of said frames, and wherein the watermark data is detected in all of the number N of said frames in a case that more than the number M of the error check codes indicate correct data reception;

code for causing the electronic device to select a first decoding mode in a case watermark data is detected or to select a second decoding mode in a case watermark data is not detected, wherein the first decoding mode comprises modeling the watermark data to obtain a decoded first signal and decoding the bitstream to obtain a decoded second signal, and the second decoding mode comprises decoding the bitstream to obtain the decoded second signal without extracting watermark data;

code for causing the electronic device to perform decoding according to the first decoding mode in a case the first decoding mode is selected or the second decoding mode in a case the second decoding mode is selected; and code for causing the electronic device to output a decoded second signal that is a second digital audio signal in a case that the watermark data is not detected or to output a decoded first signal that is a digital audio signal in a case that the watermark data is detected.

20. The computer-program product of claim 19, wherein in the case that the watermark data is detected, the instructions further comprise:

code for causing the electronic device to determine whether an error is detected based on the watermark error checking; and code for causing the electronic device to combine the decoded first signal and the decoded second signal in a case that no error is detected.

21. The computer-program product of claim 19, wherein the bitstream is a narrowband bitstream and the watermark data comprises a layer of wideband information within the narrowband bitstream.

22. The computer-program product of claim 19, wherein said frames are temporally distinct.

23. A computer-program product for encoding a watermarked signal, comprising a non-transitory tangible computer-readable medium having instructions thereon, the instructions comprising:

code for causing an electronic device to obtain a first signal and a second signal, wherein the first signal and the second signal comprise digital audio signals;

code for causing the electronic device to model the first signal to obtain watermark data;

code for causing the electronic device to add a cyclic redundancy check (CRC) error check code to multiple consecutive frames of the watermark data, wherein the watermark data is indicated based on an averaging scheme that indicates watermark data in a case that more than a number M of error check codes indicate correct data reception within a number N of said frames, wherein each of the error check codes corresponds to one of said frames, wherein the watermark data is indicated in all of the number N of said frames in a case that more than the number M of the error check codes indicate correct data reception, and wherein adding the CRC error check code indicates a mode to decode the first signal and the second signal, and comprises adding an amount of error check code to said frames that is equal to or smaller than a predetermined number of error check bits per predetermined number of information bits;

code for causing the electronic device to encode the second signal by embedding the watermark data into the second signal to obtain a watermarked second signal; and code for causing the electronic device to output the watermarked second signal, wherein the watermarked second signal comprises a digital audio signal.

24. The computer-program product of claim 23, wherein a proportion equal to or smaller than four error check bits per twenty information bits is the amount of error check code added to each of the said frames.

25. An apparatus for decoding a signal, comprising:

means for receiving a signal that comprises a digital audio signal;

means for extracting a bitstream from the signal, wherein the bitstream comprises the digital audio signal;

means for performing watermark error checking using cyclic redundancy check (CRC) on the bitstream for multiple consecutive frames;

means for determining whether watermark data is detected based on the watermark error checking, based on an averaging scheme that comprises determining whether more than a number M of error check codes indicate correct data reception within a number N of said frames, wherein each of the error check codes corresponds to one of said frames, and wherein the watermark data is detected in all of the number N of said frames in a case that more than the number M of the error check codes indicate correct data reception;

means for selecting a first decoding mode in a case watermark data is detected or selecting a second decoding mode in a case watermark data is not detected, wherein the first decoding mode comprises modeling the watermark data to obtain a decoded first signal and decoding the bitstream to obtain a decoded second signal, and the second decoding mode comprises decoding the bitstream to obtain the decoded second signal without extracting watermark data;

means for performing decoding according to the first decoding mode in a case the first decoding mode is selected or the second decoding mode in a case the second decoding mode is selected; and means for outputting a decoded second signal that is a second digital audio signal in a case that the watermark data is not detected or means for outputting a decoded first signal that is a first digital audio signal in a case that the watermark data is detected.

26. The apparatus of claim 25, wherein in the case that the watermark data is detected, the apparatus further comprises:

means for determining whether an error is detected based on the watermark error checking; and means for combining the decoded first signal and the decoded second signal in a case that no error is detected.

27. The apparatus of claim 25, wherein the bitstream is a narrowband bitstream and the watermark data comprises a layer of wideband information within the narrowband bitstream.

28. The apparatus of claim 25, wherein said frames are temporally distinct.

29. An apparatus for encoding a watermarked signal, comprising:

means for obtaining a first signal and a second signal, wherein the first signal and the second signal comprise digital audio signals;

means for modeling the first signal to obtain watermark data;

means for adding a cyclic redundancy check (CRC) error check code to multiple consecutive frames of the watermark data, wherein the watermark data is indicated based on an averaging scheme that indicates watermark data in a case that more than a number M of error check codes indicate correct data reception within a number N of said frames, wherein each of the error check codes corresponds to one of said frames, wherein the watermark data is indicated in all of the number N of said frames in a case that more than the number M of the error check codes indicate correct data reception, and wherein adding the CRC error check code indicates a mode to decode the first signal and the second signal, and comprises adding an amount of error check code to said frames that is equal to or smaller than a predetermined number of error check bits per predetermined number of information bits;

means for encoding the second signal by embedding the watermark data into the second signal to obtain a watermarked second signal; and means for outputting the watermarked second signal, wherein the watermarked second signal comprises a digital audio signal.

30. The apparatus of claim 29, wherein a proportion equal to or smaller than four error check bits per twenty information bits is the amount of error check code added to each of the said frames.

* * * * *